(12) United States Patent
Maruyama et al.

(10) Patent No.: US 7,387,679 B2
(45) Date of Patent: Jun. 17, 2008

(54) SILICON CARBIDE SINGLE CRYSTAL AND METHOD AND APPARATUS FOR PRODUCING THE SAME

(75) Inventors: Takayuki Maruyama, Kodaira (JP); Yoshinori Kobayashi, Kodaira (JP); Takuya Monbara, Kodaira (JP)

(73) Assignee: Bridgestone Corporation, Tokyo (JP)

( * ) Notice: Subject to any disclaimer, the term of this patent is extended or adjusted under 35 U.S.C. 154(b) by 0 days.

(21) Appl. No.: 10/558,369

(22) PCT Filed: May 28, 2004

(86) PCT No.: PCT/JP2004/007775

§ 371 (c)(1),
(2), (4) Date: Jun. 20, 2006

(87) PCT Pub. No.: WO2004/106596

PCT Pub. Date: Dec. 9, 2004

(65) Prior Publication Data

US 2007/0034145 A1    Feb. 15, 2007

(30) Foreign Application Priority Data

May 30, 2003    (JP)    ............................. 2003-154616

(51) Int. Cl.
*C30B 25/12* (2006.01)
*C30B 25/14* (2006.01)

(52) U.S. Cl. .................... 117/107; 117/103; 117/109; 117/952

(58) Field of Classification Search ................ 117/103, 117/107, 109, 952
See application file for complete search history.

(56) References Cited

U.S. PATENT DOCUMENTS

2002/0083891 A1    7/2002    Alexandrovich et al.

FOREIGN PATENT DOCUMENTS

| JP | 2000-219595 A | 8/2000 |
| JP | 2001-158697 A | 6/2001 |
| JP | 2002-060297 A | 2/2002 |
| JP | 2002-255693 A | 9/2002 |
| WO | WO 02/053813 A1 | 7/2002 |

OTHER PUBLICATIONS

International Search Report.

*Primary Examiner*—Felisa C Hiteshew
(74) *Attorney, Agent, or Firm*—Sughrue Mion, PLLC

(57) ABSTRACT

A method of producing a silicon carbide single crystal has storing a sublimation law material on a first end portion in a reaction container; disposing a seed crystal of a silicon carbide single crystal on a second end portion substantially facing the sublimation law material in the reaction container; and re-crystallizing the sublimated sublimation law material on the seed crystal to grow a silicon carbide single crystal, wherein a sealing portion is provided in the reaction container to grow a silicon carbide single crystal on the seed crystal provided in the sealing portion while preventing the leak of the sublimated sublimation law material from the atmosphere for sublimation.

35 Claims, 9 Drawing Sheets ured. The method of producing a silicon carbide single crystal,
SILICON CARBIDE SINGLE CRYSTAL AND METHOD AND APPARATUS FOR PRODUCING THE SAME This application claims benefit of priority based on Japanese Patent Application previously filed by this applicant, namely, No. 2003-154616 (filing date May 30, 2003, the specification of which is incorporated by reference herein.

BACKGROUND OF THE INVENTION

1. Field of the Invention

The present invention relates to a silicon carbide single crystal particularly suitable as an electronic device, optical device or the like, and a method and an apparatus which can produce this silicon carbide single crystal efficiently.

2. Description of the Related Art

Silicon carbide shows a larger band gap and is excellent in dielectric breakdown property, heat resistance, radiation resistance and the like as compared with silicon. Therefore, silicon carbide has been noticed as an electronic device material for small-size high output semiconductors and the like, or as an optical device material owing to its excellent optical property. Of such silicon carbide crystals, silicon carbide single crystals have a merit that, when applied to devices such as a wafer and the like, uniformity of properties in a wafer is particularly excellent as compared with a silicon carbide polycrystals.

Though there are some conventionally suggested methods of producing the above-mentioned silicon carbide single crystal, each of them have a problem that the resulting silicon carbide single crystal shows contamination of a polycrystal or polymorphs and crystal defects in the form of hollow pipe (so-called, micropipe).

Then, as the method of producing a silicon carbide single crystal solving such a problem, for example, a method employing an apparatus for generating a silicon carbide single crystal as shown in FIG. 10 is generally known. This silicon carbide single crystal production apparatus 80 comprises a graphite crucible 10 having a container body 12 which can accommodate a sublimation raw material 40 and having a cover body 11 which can be attached to and detached from the container body 12 and, when installed on the container body 12, can arrange a seed crystal 50 of a silicon carbide single crystal at approximately the center of a surface facing the sublimation raw material 40 accommodated in the container body 12; a supporting rod 31 fixing the graphite crucible 10 to the inside of a quartz tube 30; and an induction heating coil 25 placed, being wound in spiral form and at an equal interval, at a part around the outer periphery of the quartz tube 30 and at which part the graphite crucible 10 is situated. In the silicon carbide single crystal production apparatus 80, when the induction heating coil 25 is energized to be heated, the sublimation raw material 40 is heated by this heat. The sublimation raw material 40 sublimates when heated to given temperature. The sublimated raw material 40 does not re-crystallize until cooled to the re-crystallization temperature. Here, an atmosphere at the side of the cover body 11 has temperature lower than that in the side of the sublimation raw material 40 and the sublimation raw material 40 being sublimated can re-crystallize in this atmosphere, therefore, silicon carbide re-crystallizes on the seed crystal 50 of a silicon carbide single crystal, and the crystal of silicon carbide grows.

Under this condition, a silicon carbide single crystal 60 re-crystallizes and grows on the seed crystal 50 of a silicon carbide single crystal, and a silicon carbide polycrystal 70 re-crystallizes and grows on the peripheral part of the seed crystal 50 of a silicon carbide single crystal. Finally, as shown in FIG. 10, a concave portion 71 sinking toward the cover body 11 is shaped in the form of a ring, and the part around this concave portion 71 through at the peripheral side of the cover body 11 are in condition wherein extraneous substances, polycrystals and polymorphs are mixed and present in a large amount. At the cover body 11, the whole surface at the side facing to the inside of the container body 12 is covered by crystals of silicon carbide, and on the peripheral part of the cover body 11, a silicon carbide polycrystal 70 grows contacting with the inner peripheral surface of the container body 12. Under this condition, when cooled to room temperature, stress based on the thermal expansion difference concentrates on the side of the silicon carbide single crystal 60 from the side of the silicon carbide polycrystal 70, leading to breakage such as cracking and the like on the silicon carbide single crystal 60, as shown in FIG. 11, contamination of polycrystals and polymorphs or defects such as micropipes and the like, in some cases. At recentness wherein production of a silicon carbide single crystal of large diameter is required, this phenomenon is an important problem which should be overcome.

That is, a high quality silicon carbide single crystal showing no such breakages as cracking and the like, no contamination of polycrystals and polymorphs and having no defect such as micropipes, and a method and an apparatus which can efficiently and easily produce such a high quality silicon carbide single crystal with large diameter, are not provided yet, and these are needed to be provided, under the present situation. Some technologies are provided to solve the above problem, however, problems are not solved (see related art 1 and 2).

Related art 1:WO 02/053813 A1
Related art 2:JP2002-60297

SUMMARY OF THE INVENTION

As a first embodiment of this invention, a method of producing a silicon carbide single crystal having:

storing a sublimation law material on a first end portion in a reaction container;

disposing a seed crystal of a silicon carbide single crystal on a second end portion substantially facing the sublimation law material in the reaction container; and re-crystallizing the sublimated sublimation law material on the seed crystal to grow a silicon carbide single crystal, wherein a sealing portion is provided in the reaction container to grow a silicon carbide single crystal on the seed crystal provided in the sealing portion while preventing the leak of the sublimated sublimation law material from the atmosphere for sublimation is provided.

The method of producing a silicon carbide single crystal, wherein the thermal expansion coefficient of the sealing portion is substantially the same as that of the seed crystal is provided.

The method of producing a silicon carbide single crystal having growing the silicon carbide single crystal while maintaining the whole growing surface in a convex shape throughout all growth processes is provided.

The method of producing a silicon carbide single crystal, wherein the sublimation raw material is a silicon carbide powder obtained by using as a silicon source at least one compound selected from the group consisting of high purity methoxysilane, high purity ethoxysilane, high purity propoxysilane and high purity butoxysilane, as a carbon source a high purity organic compound generating carbon by heating;

uniformly mixing the silicon source and the carbon source to obtain a mixture; and calcinating the resulted mixture by heating under a non-oxidizing atmosphere; is provided.

As a second aspect of this invention, the product by produced by above said method is provided.

As a third aspect of this invention, a silicon carbide single crystal production apparatus, having at least a crucible having a reaction container main body capable of storing a sublimation law material; a lid portion provided detachably to the reaction container main body; and a sealing portion having substantially the same thermal expansion coefficient as that of the seed crystal, capable of placing a silicon carbide single crystal, for preventing the leak of the sublimated sublimation law material is provided.

BEST MODE FOR CARRYING OUT THE INVENTION

Figure 1:
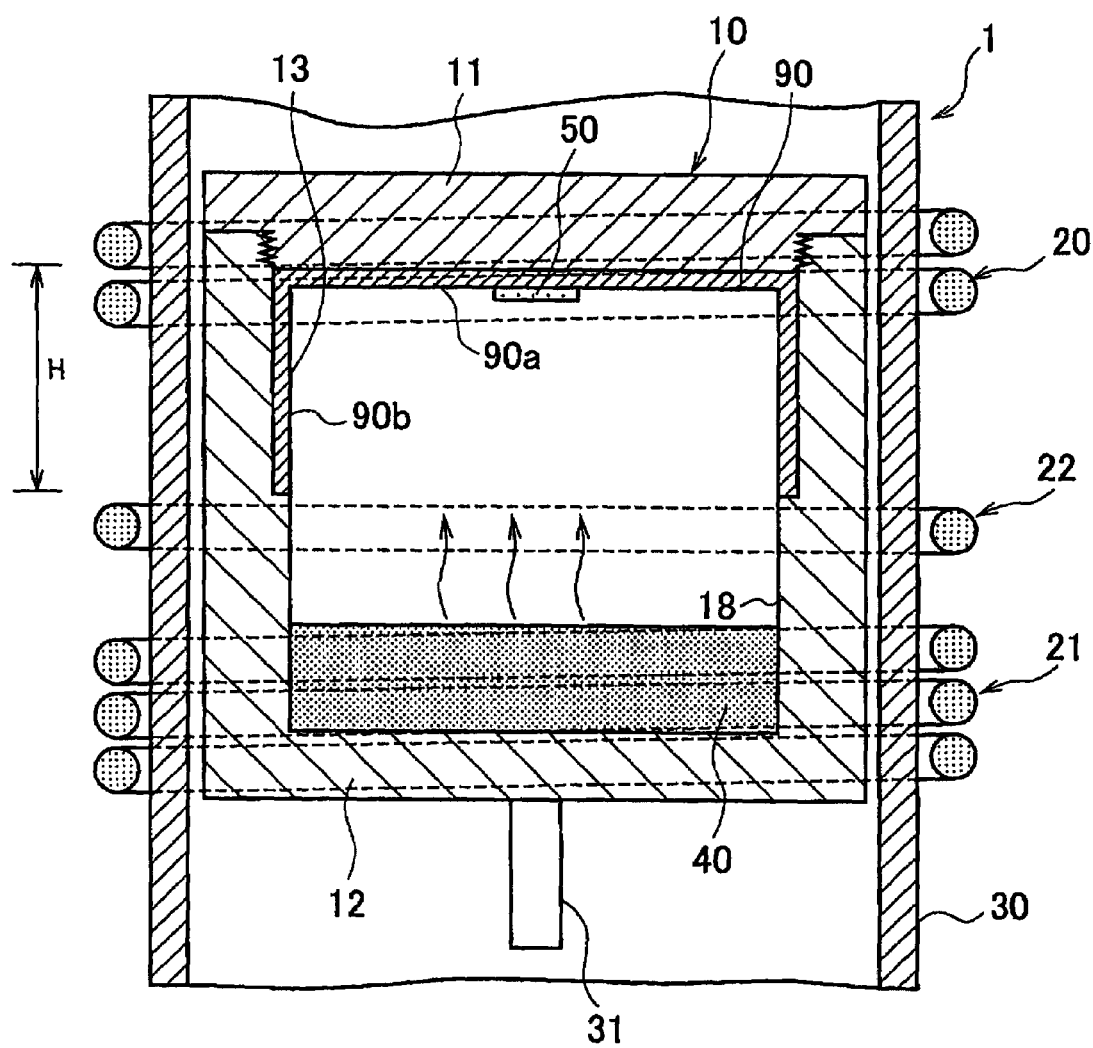
FIG. 1 is a schematic view for illustrating the initial condition in the method of producing a silicon carbide single crystal of the embodiment of the present invention.

In order to solve the conventional problems and meet the demands, an object of the present invention is to achieve the following purposes.

There has been a demand for a high quality silicon carbide single crystal having the excellent insulation destruction characteristics, heat resistance, radiation resistance, or the like, particularly suitable for the electronic devices such as a semiconductor wafer, the optical devices such as a light emitting diode, or the like, without the defects such as introduction of polycrystals or polymorphism, a micro pipe, or the like, and for a method and an apparatus capable of easily producing the high quality silicon carbide single crystal efficiently in a state without damage such as cracking with a large aperture.

As a result of the elaborate study by the present inventors, it was found out that the problems can be solved by preventing the leak of a sublimated material from the atmosphere for sublimation. Moreover, the present inventors have also found out that the problems can be solved by placing a seed crystal on a member having the same thermal expansion coefficient as that of the seed crystal.

(Production Method for a Silicon Carbide Single Crystal)

Hereinafter, a method of producing a silicon carbide single crystal of the present invention will be explained with reference to the preferable embodiments. It is needless to say that the present invention is not limited to the following embodiments.

As a first aspect of the method of producing a silicon carbide single crystal of the present invention, a method of producing a silicon carbide single crystal wherein a sublimation law material is stored on a first end portion in a reaction container and a seed crystal of a silicon carbide single crystal is disposed on a second end portion substantially facing the sublimation law material in the reaction container to re-crystallize the sublimated sublimation law material on the seed crystal to grow a silicon carbide single crystal, wherein a sealing portion is provided in the reaction container to grow a silicon carbide single crystal on the seed crystal provided in the sealing portion while preventing the leak of the sublimated sublimation law material from the atmosphere for sublimation is provided.

Since the sealing portion is provided, leak of the sublimation material from the sublimation atmosphere can be prevented. Consequently the fluctuation of the gas phase composition ratio in the sublimation atmosphere can be prevented, thereby a high quality large size single crystal can be produced.

In this case, it is preferable that the thermal expansion coefficient of the sealing portion is substantially the same as that of the seed crystal, and it is further preferable that the material of the sealing portion is graphite. Moreover, it is further preferable that the sealing portion covers a single crystal growth possible region in the sublimation atmosphere.

Since the thermal expansion coefficient of the sealing portion is substantially the same as that of the seed crystal, a high quality large size single crystal can be produced while preventing generation of cracking due to the temperature difference between the crucible contacted with the grown single crystal and the growing temperature. Furthermore, since the sealing portion covers the single crystal growth possible region in the sublimation atmosphere, the effect can further be improved by preventing generation of cracking due to the temperature difference between the crucible and the growing temperature further effectively.

(A Silicon Carbide Single Crystal Production Apparatus)

Next, the method of producing a silicon carbide single crystal will be explained in further detail with reference to the explanation of the preferable embodiments of a silicon carbide single crystal production apparatus.

First embodiment: Although the production apparatus to be used for implementing the method of producing a silicon carbide single crystal is not particularly limited, as a first embodiment of a silicon carbide single crystal production apparatus, a production apparatus comprising at least a crucible having a reaction container main body capable of storing a sublimation law material; a lid portion provided detachably to the reaction container main body; and a sealing portion capable of placing a silicon carbide single crystal, for preventing the leak of the sublimated sublimation law material can be presented.

In this case, as the crucible as a reaction container, a crucible comprising at least a reaction container main body and a lid portion optionally selected from the known ones without any limitation, and further provided with a sealing portion can be used.

The site accommodating the above-mentioned sublimation raw material is not particularly restricted, and preferably an end approximately facing one end at which the above-mentioned seed crystal of a silicon carbide single crystal can be placed. In this case, the inside of the above-mentioned reaction container is in the form of cylinder, and the axis of this cylindrical form may be linear or curved, and the form of a section vertical to the axis direction of this cylindrical form may be circle or polygon. Suitably listed as the preferable example of the circular form are those having a linear axis and having a section vertical to the axis direction, in the form of circle.

When two ends are present in the above-mentioned reaction container, the above-mentioned sublimation raw material is accommodated in one end side and the above-mentioned seed crystal of a silicon carbide single crystal is placed in another end side. Hereinafter, the above-mentioned one end may be referred to as "sublimation raw material accommodating part", and the above-mentioned another end may be referred to as "seed crystal placing part".

The form of the above-mentioned one end (sublimation raw material accommodating part) is not particularly restricted, and maybe in the flat form, or a structure for promoting soaking (for example, convex portion and the like) may be appropriately provided.

In the reaction container, it is preferable that the second end portion (seed crystal placing portion) side is designed detachably. Specifically, it is preferable that the second end portion has the lid portion designed detachably with respect to the reaction container main body, and further more, the sealing portion to be explained later is disposed capable of sealing the joint part between the reaction container main body and the lid portion such that the sealing portion can be stored inside the reaction container at the time of mounting the lid portion on the reaction container. In this case, it is advantageous in that the grown silicon carbide single crystal can easily be separated from the reaction container only by detaching the lid portion mounted on the second end portion (seed crystal placing portion) and the sealing portion.

The positional relationship between the first end portion (storage portion for the sublimation law material) and the second end portion (seed crystal placing portion) can be selected optionally according to the purpose without any limitation. However, an embodiment wherein the first end portion is the lower end portion and the second end portion is the upper end portion, that is, the first end portion and the second end portion are disposed in the gravity direction is preferable. This is preferable in that the sublimation of the sublimation law material can be carried out smoothly, and moreover, the growth of the silicon carbide single crystal can be carried out downward, that is, in the gravity direction without application of excessive load.

At the above-mentioned one end, a member formed of a material excellent in heat conductivity, for example, may be placed for the purpose of conducting sublimation of the above-mentioned sublimation raw material efficiently.

Suitably listed as this member are, for example, members in the form of reverse cone or reverse truncated cone of which outer periphery can closely contact with the peripheral side surface part in the above-mentioned reaction container and of which inner diameter gradually increases when approaching the above-mentioned another end (seed crystal placing part), and other members.

On the portion exposed to the outside of the above-mentioned reaction container, threading, concave portion for measuring temperature, and the like may be provided, depending on the object, and the concave portion for measuring temperature is preferably provided at at least one of the above-mentioned one end side and the above-mentioned another end side.

The material of the above-mentioned reaction container is not particularly restricted and can be appropriately selected depending on the object, and it is preferable that the reaction container is formed of a material excellent in durability, heat resistance, heat conductivity and the like, and particularly preferable is graphite in that contamination of polycrystals and polymorphs due to generation of impurities is little and control of sublimation and re-crystallization of the above-mentioned sublimation raw material is easy, and the like, in addition to the above-mentioned properties.

The above-mentioned reaction container may be formed from a single member, or two or more members, and members can be appropriately selected depending on the object. When formed from two or more members, it is preferable that the above-mentioned another end (seed crystal placing part) is formed from two or more members, and it is more preferable that the center part and its peripheral part of the above-mentioned another end (seed crystal placing part) are formed from different members since the temperature difference or temperature gradient can be formed.

Specifically, it is particularly preferable that the reaction container comprises an inner side region adjacent to the region for carrying out the silicon carbide single crystal growth in the second end portion and an outer side region on the outer circumference of the inner side region as independent members such that one end of the member comprising the inner side region is contacted with a sealing portion provided in the reaction container and the other end is exposed to the outside of the reaction container. For example, a reaction container having a lid portion comprising two or more members to be explained later with reference to FIGS. 7 and 8 in the column of the reference example can be used.

In this case, when the above-mentioned another end (seed crystal placing part) is heated from its outside, the above-mentioned outside region is heated easily, however, the above-mentioned inside region is not easily heated due to contact resistance with the outside region. Therefore, a difference in temperature occurs between the above-mentioned outside region and the above-mentioned inside region, the temperature of the inside region is maintained slightly lower than the temperature of the outside region, and silicon carbide can be re-crystallized more easily in the inside region than in the outside region. Further, since the above-mentioned another end of a member forming the above-mentioned inside region is exposed to the outside of the above-mentioned reaction container, the inside region easily discharges heat to the outside of the above-mentioned reaction container, consequently, silicon carbide is re-crystallized more easily in the inside region than in the outside region.

Here, the embodiment in which the above-mentioned another end of a member forming the above-mentioned inside region is exposed to the outside of the above-mentioned reaction container is not particularly restricted, and shapes having the inside region as the bottom surface and having a diameter varying (increasing or decreasing) continuously or discontinuously toward the outside of the above-mentioned reaction container, and the like are listed.

Specifically listed as such a form are pillar forms having the inside region as the bottom surface (cylinder, prism and the like are listed, and cylinder is preferable), truncated pyramidal forms (truncated cone, truncated pyramid, reverse truncated cone, reverse truncated pyramid and the like are listed, and reverse truncated cone is preferable), and the like.

Moreover, in order to improve the thermal contact between the one end of the member comprising the inner side region and the sealing portion provided in the reaction container, it is also preferable to bond the contact portion or to provide a projected shape portion, a rugged shape portion, or the like on one side or both sides of the contact portion in terms of improving the thermal discharge of the inner side region for facilitating the re-crystallization of the silicon carbide. It is needless to say that the same means is effective also in the case the second end portion consists of a single member.

It is preferable that the reaction container has the surface of at least the inner circumference side portion of the sealing portion in the second end part of a glass like carbon or an amorphous carbon. Thereby, the re-crystallization of the silicon carbide can be restrained at least on the surface of the inner circumference side portion. In this case, it is further preferable that the surface of the rim portion circumference of the bottom portion for installing the seed crystal in the sealing portion is made of the glass like carbon or amorphous carbon.

The reaction container main body is not particularly limited as long as it has the function of storing the sublimation law material so that any known one can be used.

As the lid portion, one provided detachably to the reaction container main body is preferable, and known one can be used. The reaction container main body and the lid portion can be designed detachably by fitting, screwing, or the like, but one provided by screwing is preferable.

The material of the reaction container main body and the lid portion comprising the crucible as the reaction container is not particularly limited, and it can be selected optionally from the known ones, however, one made of a graphite is particularly preferable.

The sealing portion is not particularly limited as long as it can install the seed crystal of the silicon carbide single crystal and prevent the leak of the sublimated sublimation law material , but one having substantially the same thermal expansion coefficient as that of the seed crystal is preferable, and one having the sealing portion made of a graphite is particularly preferable. As to the thermal expansion coefficient of the sealing portion, it is preferable that the thermal expansion coefficient at 0 to 100° C. is $3.2 \times 10^{-6}$ (/K). With the value, the thermal expansion coefficient at the single crystal growth temperature to 2,500° C. can be substantially the same as that of the seed crystal. Moreover, in the case the sealing portion is made of a graphite, it is preferable that the bulk density of the graphite is about 1.82 g/cm$^3$.

It is further preferable that the sealing portion forms the inner circumference side portion of the reaction container so as to cover the single crystal growth possible region at the time of mounting the bottom portion for installing the seed crystal in the reaction container so as to substantially face the sublimation law material. It is preferable that the sealing portion is detachable to the reaction container main body. It is particularly preferable that the material of the sealing portion is a graphite.

According to the production apparatus for the silicon carbide single crystal, in general, at the time of mounting the sealing portion on the reaction container main body, the seed crystal of the silicon carbide single crystal is disposed substantially at the center of the surface facing the sublimation law material stored in the reaction container main body.

It is preferable that the reaction container is surrounded by an insulation material, or the like. In this case, it is preferable that the insulation material, or the like is not provided substantially in the center of the first end portion in the reaction container (sublimation law material storage portion) and the second end portion (seed crystal disposing portion) for the purpose of forming a temperature measuring window. Moreover, in the case the temperature measuring window is provided substantially in the center of the first end portion (sublimation law material storage portion), it is preferable that a graphite cover member, or the like is further provided for preventing dropping of the insulation material, or the like.

It is preferable that the reaction container is disposed in a quartz pipe. This is preferable in that the heating energy for the sublimation and the re-crystallization of the sublimation law material is hardly lost.

As to the quartz pipe, a high purity product can be accessible, and using the high purity product is advantageous in that the amount of the metal impurity is low.

Second embodiment: As a second embodiment of the silicon carbide single crystal production apparatus to be used for implementing the method of producing a silicon carbide single crystal, the a production apparatus for the silicon carbide single crystal comprising a reaction container main body capable of storing a sublimation law material ; a lid portion provided detachably to the reaction container main body; and a sealing portion capable of placing a silicon carbide single crystal, for preventing the leak of the sublimated sublimation law material ; and furthermore, a first induction heating coil disposed in a spirally wound state on the outer circumference of the portion for storing the sublimation law material in the crucible for forming the atmosphere for sublimation for allowing sublimation of the sublimation law material; and a second induction heating coil for disposed in a spirally wound state on the outer circumference of the portion for storing the seed crystal in the crucible for forming the re-crystallization atmosphere for re-crystallization for allowing the re-crystallization of the sublimation law material sublimated by the first induction heating coil only in the vicinity of the seed crystal of the silicon carbide single crystal for re-crystallizing the sublimation law material on the seed crystal of the silicon carbide single crystal can be presented. In this case, it is further preferable that an interference preventing coil (interference preventing means) is disposed between the first induction heating coil (first heating means) and the second induction heating coil (second heating means), capable of supplying an induction electric current and preventing the interference between the first induction heating coil and the second induction heating coil by supplying the induction electric current. It is further preferable that the interference preventing coil is a coil allowing passage of the cooling water.

Here, explanation is omitted for the same configuration elements as those of the first embodiment of the silicon carbide single crystal production apparatus, and only the different points will be explained.

The first induction heating coil is not particularly limited as long as it is heated by the electricity supply so as to form the atmosphere for sublimation capable of sublimating the sublimation law material so that a coil for induction heating, or the like can be presented preferably.

The first induction heating coil is disposed in a wound state around the outer circumference of the portion for storing the sublimation law material in the crucible.

The second induction heating coil is not particularly limited as long as the sublimation law material is re-crystallized on the seed crystal of the silicon carbide by forming the atmosphere for re-crystallization such that the sublimated sublimation law material by the first induction heating coil only in the vicinity of the seed crystal of the silicon carbide so that a coil for induction heating, or the like can be presented preferably.

The second induction heating coil is disposed in a wound state around the outer circumference of the portion for storing the seed crystal for the silicon carbide in the crucible.

According to the silicon carbide single crystal production apparatus, the first induction heating coil forms the atmosphere for sublimation capable of sublimating the sublimation law material so as to sublimate the sublimation law material. Then, the second induction heating coil forms the atmosphere for re-crystallization such that the sublimation law material sublimated by the first induction heating coil can be re-crystallized only in the vicinity of the seed crystal to re-crystallize the sublimation law material on the seed crystal. Therefore, the silicon carbide single crystal to be grown has the entire surface of its growing surface kept in a projecting shape toward its growing direction in the entire growing process without formation of a ring like recessed portion dented to the lid portion, or without growing the silicon carbide polycrystals in a state in contact with the circumferential side surface portion in the reaction container main body. Therefore, at the time of cooling down the grown silicon carbide single crystal to the room temperature, breakage such as cracking cannot be generated in the silicon carbide single crystal to be obtained without concentrated application of the stress from the silicon carbide polycrystal side to the silicon carbide single crystal side based on the thermal expansion difference. As a result, a high quality silicon carbide single crystal can be produced efficiently and certainly without the conventional problems such as breakage like cracking or the crystal defects such as introduction of polycrystals or polymorphism, a micro pipe, or the like.

Sublimation Raw Material

Regarding the above-mentioned sublimation raw material, the polymorphs of a crystal, use amount, purity, its production method and the like are not particularly restricted as long as the material is made of silicon carbide, and can be appropriately selected depending on the object.

As the polymorphs of a crystal of the above-mentioned sublimation raw material, for example, 4H, 6H, 15R, 3C and the like listed, and among them, 6H and the like are suitably listed. These are preferably used alone, however, two or more of them may be used in combination.

The use amount of the above-mentioned sublimation raw material can be appropriately selected depending on the size of a silicon carbide single crystal produced, the size of the above-mentioned reaction container, and the like.

The purity of the above-mentioned sublimation raw material is preferably higher from the standpoint of preventing contamination of polycrystals and polymorphs into a silicon carbide single crystal produced as much as possible, and specifically, it is preferable that the content of each impurity element is 0.5 ppm or less.

Here, the content of the above-mentioned impurity elements is impurity content by chemical analysis, and only means a reference values, and practically, evaluation differs depending on whether the above-mentioned impurity elements are uniformly distributed in the above-mentioned silicon carbide single crystal or not, or whether they are localized or not. Here, "impurity element" means elements belonging to Groups I to XVII in the Periodic Table according to 1989, IUPAC Inorganic Chemical Nomenclature Revision and at the same time having an atomic number of 3 or more (excluding carbon atom, oxygen atom and silicon atom). When dopant elements such as nitrogen, aluminum and the like are added by intention for imparting n-type or p-type conductivity to a silicon carbide single crystal to be grown, these elements are also excluded.

A silicon carbide powder as the above-mentioned sublimation raw material is obtained, for example, by dissolving at least one silicon compound as a silicon source, at least one organic compound generating carbon by heating as a carbon source, and a polymerization catalyst or cross-linking catalyst in a solvent and drying the resulted solution to give a powder, and calcinating the resulted powder under a non-oxidating atmosphere.

As the above-mentioned silicon compound, liquid compounds and solid compounds can be used together, however, at least one compound is selected from liquid compounds.

As the above-mentioned liquid compound, alkoxysilanes and alkoxysilane polymers are suitably used.

As the above-mentioned alkoxysilane, for example, methoxysilane, ethoxysilane, propoxysilane, butoxysilane and the like are listed, and among them, ethoxysilane is preferable from the standpoint of handling.

The above-mentioned alkoxysilane may be any of monoalkoxysilanes, dialkoxysilane, trialkoxysilane and tetraalkoxysilane, and tetraalkoxysilanes are preferable.

As the above-mentioned alkoxysilane polymer, lower molecular weight polymers (oligomers) having a degree of polymerization of from about 2 to 15 and silicic acid polymers are listed. For example, a tetraethoxysilane oligomer is mentioned.

As the above-mentioned solid compound, silicon oxides such as SiO, silica sol (colloidal ultrafine silica-containing liquid, having an OH group and alkoxyl group inside), silicon dioxides (silica gel, fine silica, quartz powder) and the like are listed.

The above-mentioned silicon compounds may be used alone or in combination of two or more.

Among the above-mentioned silicon compounds, a tetraethoxysilane oligomer, a mixture of a tetraethoxysilane oligomer and fine powdery silica, and the like are preferable from the standpoint of excellent uniformity and handling property.

The above-mentioned silicon compound preferably has high purity, and the content of each impurity at the initial period is preferably 20 ppm or less, more preferably 5 ppm or less.

As the above-mentioned organic compound generating carbon by heating, a liquid organic compound may be used alone and a liquid organic compound and a solid organic compound may be used together.

As the above-mentioned organic compound generating carbon by heating, organic compounds manifesting high carbon-remaining ratio and being polymerized or crosslinked by a catalyst or heat are preferable, and for example, monomers and prepolymers of phenol resins, furan resins, resins such as polyimides, polyurethanes, polyvinyl alcohol and the like, are preferable, and additionally, liquid substances such as cellulose, sucrose, pitch, tar and the like are mentioned. Among them, those of high purity are preferable, phenol resins are more preferable, and resol type phenol resins are particularly preferable.

The above-mentioned organic compound generating carbon by heating may be used alone or in combination of two or more.

The purity of the above-mentioned organic compound generating carbon by heating can be appropriately selected depending on the object, and when a high purity silicon carbide powder is necessary, it is preferable to use organic compounds in which the content of each metal is not 5 ppm or more.

The above-mentioned polymerization catalyst and crosslinking catalyst can be appropriately selected depending on the above-mentioned organic compound generating carbon by heating, and when the above-mentioned organic compound generating carbon by heating is a phenol resin or furan resin, acids such as toluenesulfonic acid, toluenecarboxylic acid, acetic acid, oxalic acid, maleic acid, sulfuric acid and the like are preferable, and maleic acid is particularly preferable.

The ratio of carbon contained in the above-mentioned organic compound generating carbon by heating to silicon contained in the above-mentioned silicon compound (hereinafter, abbreviated as C/Si ratio) is defined by element-analyzing a carbide intermediate obtained by carbonizing a mixture of the mat 1000° C. Stoichiometrically, the content of free carbon in a silicon carbide powder obtained when the above-mentioned C/Si ratio is 3.0 should be 0%, however, free carbon generates at lower C/Si ratio by vaporization of a simultaneously produced SiO gas, actually. It is preferable to previously determine the compounding ratio so that the amount of free carbon in the resulted silicon carbide powder is suitable amount. Usually, by calcinations at 1600° C. or higher at around 1 atm, free carbon can be controlled when the above-mentioned C/Si ratio is 2.0 to 2.5. When the above-mentioned C/Si ratio is over 2.5, the above-mentioned free carbon increases remarkably. However, when calcinations is conducted at lower atmosphere pressure or higher atmosphere pressure, the C/Si ratio for obtaining a pure silicon carbide powder varies, therefore, the ratio is not necessarily limited in the above-mentioned C/Si range, in this case.

The above-mentioned silicon carbide powder is obtained also by hardening a mixture of the above-mentioned silicon compound and the above-mentioned organic compound generating carbon by heating, for example.

As the above-mentioned hardening method, a method of hardening by heating, a method of hardening by a hardening catalyst, methods using electronic beam and radiation, and the like are listed.

The above-mentioned hardening catalyst can be appropriately selected depending on the kind of the above-mentioned organic compound generating carbon by heating, and the like, and in the case of a phenol resin or furan resin, acids such as toluenesulfonic acid, toluenecarboxylic acid, acetic acid, oxalic acid, hydrochloric acid, sulfuric acid, maleic acid and the like, amic acids such as hexamine, and the like are suitably listed. When these hardening catalysts are used, the hardening catalyst is dissolved or dispersed in a solvent. As the above-mentioned catalyst, lower alcohols (for example, ethyl alcohol and the like), ethyl ether, acetone and the like are listed.

A silicon carbide powder obtained as described above is calcinated in a non-oxidizing atmosphere such as nitrogen, argon and the like at 800 to 1000° C. for 30 to 120 minutes.

By the above-mentioned calcinations, the above-mentioned silicon carbide powder becomes a carbide, and by calcinating this carbide in a non-oxidizing atmosphere such as argon and the like at 1350 to 2000° C., a silicon carbide powder is produced.

The temperature and time of the above-mentioned calcinations can be appropriately selected depending on the granular size of a silicon carbide powder to be obtained, and the above-mentioned temperature is preferably from 1600 to 1900° C. from the standpoint of more effective production of a silicon carbide powder.

For the purpose of removing impurities and obtaining a high purity silicon carbide powder, after the above-mentioned calcinations, it is preferable to conduct heat treatment at 2000 to 2400° C. for 3 to 8 hours.

Since the silicon carbide powder obtained as described above has non-uniform size, given particle size can be obtained by powder destruction, classification and the like.

The average particle size of the above-mentioned silicon carbide powder is preferably from 10 to 700 μm, more preferably from 100 to 400 μm.

When the above-mentioned average particle size is less than 10 μm, sintering occurs quickly at the sublimation temperature (1800 to 2700° C.) of silicon carbide for growing a silicon carbide single crystal, therefore, sublimation surface area decreases and growth of a silicon carbide single crystal delays, in some cases, and when a silicon carbide powder is accommodated in the above-mentioned reaction container and when the pressure of a re-crystallization atmosphere is changed for control of the growth speed, a silicon carbide powder is splashed easily. On the other hand, when the above-mentioned average particle size is over 500 μm, the specific surface area of a silicon carbide powder itself decreases, therefore, growth of a silicon carbide single crystal may delay also in this case.

As the above-mentioned silicon carbide powder, any of 4H, 6H, 15R, 3C and mixtures of them may be used. The grade of the above-mentioned 3C silicon carbide powder is not particularly restricted, and those generally marketed may be permissible, however, those of high purity are preferable.

Further, nitrogen or aluminum and the like can be introduced into a silicon carbide single crystal grown using the above-mentioned silicon carbide powder for the purpose of giving n type or p type conductivity, and when nitrogen or aluminum is introduced in generating the above-mentioned silicon carbide powder, it is recommendable that, first, the above-mentioned silicon source, the above-mentioned carbon source, an organic substance composed of a nitrogen source or aluminum source, the above-mentioned polymerization catalyst or crosslinking catalyst are uniformly mixed. In this case, it is preferable that, for example, when a carbon source such as phenol resins and the like, an organic substance composed of a nitrogen source such as hexamethylenetetramine and the like and a polymerization or crosslinking catalyst such as maleic acid and the like are dissolved in a solvent such as ethanol and the like, they are mixed sufficiently with a silicon source such as a tetraethoxysilane oligomer and the like.

As the above-mentioned organic substance composed of a nitrogen source, substances generating nitrogen by heating are preferable, and listed are, for example, polymer compounds (specifically, polyimide resins, nylon resins and the like), various amines such as organic amines (specifically, hexamethylenetetramine, ammonia, triethylamine, and the like, and compounds and salts of them). Of them, hexamethylenetetramine is preferable. A phenol resin synthesized using hexamine as a catalyst and containing nitrogen derived from this synthesis process in an amount of 2.0 mmol or more based on 1 g of the resin can also be suitably used as the organic substance composed of a nitrogen source. These organic substances composed of a nitrogen source may be used alone or in combination of two or more. The above-mentioned organic substance composed of an aluminum source is not particularly restricted and can be appropriately selected depending on the object.

Regarding the addition amount of the above-mentioned organic substance composed of a nitrogen source, when the above-mentioned silicon source and the above-mentioned carbon source are added simultaneously, nitrogen is contained in an amount of preferably 1 mmol or more based on 1 g of the above-mentioned silicon source, and the organic substance is added in an amount of 80 to 1000 μg based on 1 g of the above-mentioned silicon source.

The materials for sublimation in the production of a silicon carbide single crystal can be presented more specifically as follows. As the sublimation law material, it is preferable to use carbonized silicon powders obtained by heating a mixture obtained by evenly mixing a high purity alkoxy silane as the silicon source and a high purity organic compound to produce a carbon by heating as the carbon source, heating and baking the same under a non oxidizing atmosphere. Moreover, as the sublimation law material, it is preferable to use carbonized silicon powders obtained by heating a mixture obtained by evenly mixing a high purity alkoxy silane and a high purity alkoxy silane copolymer as the silicon source and a high purity organic compound to produce a carbon by heating as the carbon source, heating and baking the same under a non oxidizing atmosphere. Moreover, as the sublimation law material , it is preferable to use carbonized silicon powders obtained by heating a mixture obtained by evenly mixing at least one selected from the group consisting of a high purity methoxy silane, a high purity ethoxy silane, a high purity propoxy silane and a high purity butoxy silane as the silicon source and a high purity organic compound to produce a carbon by heating as the carbon source, heating and baking the same under a non oxidizing atmosphere. Furthermore, as the sublimation law material, it is preferable to use carbonized silicon powders obtained by heating a mixture obtained by evenly mixing at least one selected from the group consisting of a high purity methoxy silane, a high purity ethoxy silane, a high purity propoxysilane, a high purity butoxysilane and a polymer thereof having a 2 to 15 polymerization degree as the silicon source and a high purity organic compound to produce a carbon by heating as the carbon source, heating and baking the same under a non oxidizing atmosphere. As the sublimation law material, it is preferable to use carbonized silicon powders obtained by heating a mixture obtained by evenly mixing at least one selected from the group consisting of a high purity monoalkoxy silane, a high purity dialkoxy silane, a high purity trialkoxy silane, a high purity tetraalkoxy silane and a polymer thereof having a 2 to 15 polymerization degree as the silicon source and a high purity organic compound to produce a carbon by heating as the carbon source, heating and baking the same under a non oxidizing atmosphere.

Sublimation

It is preferable to conduct sublimation of the above-mentioned sublimation raw material by using a separate heating means from a heating means for effecting heating necessary for re-crystallization, from the standpoints of precise control and independent control of the heating means and prevention of interference and the like. In this embodiment, the number of heating means is two or more, and two heating means are preferably used in the present invention.

In the preferable embodiment in which two of the above-mentioned heating means are used, a heating means for forming a sublimation atmosphere enabling sublimation of the above-mentioned sublimation raw material is a first heating means and a heating means for forming the above-mentioned re-crystallization atmosphere enabling re-crystallization of the above-mentioned sublimation raw material being sublimate only around the above-mentioned seed crystal of a silicon carbide single crystal is a second heating means.

The above-mentioned first heating means is placed at the one end (sublimation raw material accommodating part) side of the above-mentioned reaction container, forms a sublimation atmosphere so as to enable sublimation of the above-mentioned sublimation raw material, and heats the above-mentioned sublimation raw material to cause sublimation.

The above-mentioned first heating means is not particularly restricted and can be appropriately selected depending on the object, and for example, induction heating means, resistance heating means and the like are listed, and the induction heating means are preferable since temperature control is easy, and among the induction heating means, induction-heatable coils are preferable.

When the above-mentioned first heating means is an induction-heatable coil, the number of winding is not particularly restricted and can be determined so that heating efficiency and temperature efficiency are optimum depending on the distance from the above-mentioned second heating means, the material of the above-mentioned reaction container, and the like.

Growth of Silicon Carbide Single Crystal

Growth of the above-mentioned silicon carbide single crystal is conducted on a seed crystal of a silicon carbide single crystal placed on the above-mentioned another end (seed crystal placing part) of the above-mentioned reaction container.

Regarding the above-mentioned seed crystal of a silicon carbide single crystal, the polymorphs, size and the like of the crystal can be appropriately selected depending on the object, and as the polymorphs of the crystal, the same polymorph as that of a silicon carbide single crystal to be obtained is selected, usually.

For re-crystallizing and growing the above-mentioned silicon carbide single crystal on the above-mentioned seed crystal, it is preferable to form a re-crystallization atmosphere having temperature lower than the temperature for sublimation of the above-mentioned sublimation raw material and enabling re-crystallization of the above-mentioned sublimation raw material being sublimate only around the above-mentioned seed crystal (in other words, temperature distribution and atmosphere so that temperature becomes lower when approximating the centerpart (center of the inside region), along the diameter direction of a surface on which the above-mentioned seed crystal is placed).

Formation of the above-mentioned re-crystallization atmosphere can be more suitably conducted by the above-mentioned second heating means. Such a second heating means is placed at another end (seed crystal placing part) side of the above-mentioned reaction container and forms a re-crystallization atmosphere so as to enable re-crystallization of the above-mentioned sublimation raw material being sublimate by the above-mentioned first heating means only around the seed crystal of a silicon carbide single crystal, and causes re-crystallization of the sublimation raw material on the above-mentioned seed crystal of a silicon carbide single crystal.

The above-mentioned second heating means is not particularly restricted and can be appropriately selected depending on the object. For example, induction heating means, resistance heating means and the like are listed, and the induction heating means are preferable since temperature control is easy, and among the induction heating means, induction-heatable coils are preferable.

When the above-mentioned second heating means is an induction-heatable coil, the number of winding is not particularly restricted and can be determined so that heating efficiency and temperature efficiency are optimum depending on the distance from the above-mentioned first heating means, the material of the above-mentioned reaction container, and the like.

The quantity of induction heating current flowing through the above-mentioned second heating means can be appropriately determined depending on relation with the quantity of induction heating current flowing through the above-mentioned first heating means, and regarding the relation of them, it is preferable that the current value of induction heating current in the above-mentioned first heating means is larger than the current value of induction heating current in the above-mentioned second heating means. This case is advantage in that the temperature of a re-crystallization atmosphere around on the above-mentioned seed crystal is maintained lower than the temperature of an atmosphere in which the above-mentioned sublimation raw material sublimates, and re-crystallization is conducted easily.

It is preferable to control the current value of induction heating current in the above-mentioned second heating means so that it decreases continuously or gradually when the diameter of a silicon carbide single crystal to be grown increases. In this case, the heating quantity by the above-mentioned second heating means is controlled small when the above-mentioned silicon carbide single crystal grows, consequently, re-crystallization is conducted only around the above-mentioned silicon carbide single crystal keeping growing, and formation of polycrystals around the silicon carbide single crystal is effectively suppressed, advantageously.

A preferable tendency is obtained when the current value of induction heating current in the above-mentioned second heating means is controlled small when the diameter of the above-mentioned seed crystal of a silicon carbide single crystal is large and controlled large when the above-mentioned diameter is small.

In the present invention, the above-mentioned second heating means can be controlled independently from the above-mentioned first heating means, therefore, preferable growth speed can be maintained through the all growth processes of a silicon carbide single crystal by appropriately controlling the heating quantity of the second heating means depending on the growth speed of a silicon carbide single crystal.

The temperature of a re-crystallization atmosphere formed by the above-mentioned second heating means is lower than the temperature of the above-mentioned sublimation atmosphere formed by the above-mentioned first heating means by preferably 30 to 300° C., more preferably 30 to 150° C.

The pressure of a re-crystallization atmosphere formed by the above-mentioned second heating means is preferably from 10 to 100 Torr (1330 to 13300 Pa). When this pressure condition is applied, it is preferable that pressure reduction is not effected at ambient temperature, and after heating to given temperature, pressure reduction is effected to control pressure condition so as to fall within the above-mentioned given numerical value range.

It is preferable that the above-mentioned re-crystallization atmosphere is an inert gas atmosphere composed of an argon gas and the like.

In the present invention, it is preferable from the standpoint of obtaining a silicon carbide single crystal having large diameter that temperature at one end (sublimation raw material accommodating part) side accommodating a sublimation raw material, in the above-mentioned reaction container, controlled by the above-mentioned first heating means, temperature of the center part at another end (seed crystal placing part) side carrying the above-mentioned seed of a silicon carbide single crystal placed, in the above-mentioned reaction container, controlled by the above-mentioned second heating means, and temperature of parts situated at the outside of the center part and adjacent to the inner peripheral surface part of the reaction container are controlled in a relation described below. Namely, it is preferable to conduct control so that, if the temperature at one end side accommodating a sublimation raw material is represented by $T_1$, the temperature at another end side at which a seed crystal of a silicon carbide single crystal is placed is represented by $T_2$, and the temperature of parts adjacent to the inner peripheral surface part of the reaction container, at another end side, is represented by $T_3$, then, $T_3$-$T_2$ and $T_1$-$T_2$ increase continuously or gradually.

In this case, since $T_1$-$T_2$ increases continuously or gradually, even if a silicon carbide single crystal keeps on growing toward the above-mentioned one end side with the lapse of time, the peak side of crystal growth of the silicon carbide single crystal is usually maintained at condition liable to cause re-crystallization. On the other hand, since $T_3$-$T_2$ increases continuously or gradually, even if a silicon carbide single crystal keeps on growing toward the outer peripheral direction at above-mentioned another end side with the lapse of time, the outer peripheral end side of crystal growth of the silicon carbide single crystal is usually maintained at condition liable to cause re-crystallization. As a result, production of a silicon carbide single crystal is effectively suppressed, and the silicon carbide single crystal keeps on growing toward the direction of increasing its thickness while enlarging its diameter, finally, a silicon carbide single crystal having large diameter is obtained without contamination of a silicon carbide polycrystal and the like, advantageously.

In the present invention, the above-mentioned silicon carbide single crystal re-crystallizes and grows according to the above-mentioned first to third embodiments.

In the above-mentioned first embodiment, the above-mentioned silicon carbide single crystal is allowed to grow while keeping the whole surface of its growth surface in convex shape through the all growth processes. In this case, a concave portion sunk toward the above-mentioned another end (seed crystal placing part) side is not shaped in the form of ring, at the whole surface of the growth surface of the silicon carbide single crystal.

In the above-mentioned second embodiment, growth of the above-mentioned silicon carbide single crystal is conducted only in the region excepting parts adjacent to the peripheral surface part in the reaction container (inside region), at the above-mentioned end of the above-mentioned reaction container.

In this case, a concave portion sunk toward to the above-mentioned another end (seed crystal placing part) side of the above-mentioned reaction container is not shaped in the form of ring at the whole surface of its growth surface of the above-mentioned silicon carbide single crystal, and a silicon carbide single crystal does not grow contacting with the peripheral surface part in the reaction container, at the above-mentioned another end (seed crystal placing part). Therefore, when a silicon carbide single crystal grown is cooled to room temperature, stress based on a difference in thermal expansion does not concentrate from the silicon carbide polycrystal side to the silicon carbide single crystal side, and breakages such as cracking and the like do not occur on the resulted silicon carbide single crystal.

Regarding the form of the above-mentioned silicon carbide single crystal to be grown, it is preferable that the whole surface of its growth surface is in convex form toward its growth direction side, and when the above-mentioned one end (sublimation raw material accommodating part) faces the above-mentioned another end (seed crystal placing part), it is preferable that the whole surface of its growth surface is in convex form toward the above-mentioned sublimation raw material side, namely, toward the above-mentioned one end (sublimation raw material accommodating part) side.

This case is preferable in that a concave portion sunk toward the above-mentioned another end (seed crystal placing part) side is not present, on which contamination of polycrystals and polymorphs is significant and concentration of stress based on a difference in thermal expansion is believed to be easy.

Regarding the form of the above-mentioned silicon carbide single crystal to be grown, it may not in the above-mentioned convex form or a flat portion may be partially contained, providing the whole surface of its growth surface does not contain a part sunk toward the reverse side to its growth direction side.

The form of a silicon carbide crystal containing a silicon carbide single crystal is preferably in angle form toward the above-mentioned sublimation raw material side, namely, toward the above-mentioned one end side, and an approximate protruded shape having diameter decreasing gradually is more preferable. In other words, it is preferable that a silicon carbide crystal containing a silicon carbide single crystal is allowed to grow while keeping approximate protruded shape having diameter decreasing gradually when approximating the sublimation raw material side, through the all growth processes.

In skirt parts of a silicon carbide crystal in the form of the above-mentioned approximate protruded shape, namely, at outer peripheral parts, silicon carbide polycrystals and polymosphism may be mixed, however, generation of this mixing can be prevented by combination of the thickness, size, form and the like of the above-mentioned seed crystal with the heating quantity by the above-mentioned second heating means. Prevention of the contamination of silicon carbide polycrystals and polymorphs is preferable since then the above-mentioned silicon carbide crystal containing silicon carbide can be made only of a silicon carbide single crystal.

In the present invention, a plate member in the form of ring may also be fixed and placed on the peripheral surface part in the above-mentioned reaction container, approximately in parallel to the above-mentioned another end (seed crystal placing part). In this case, when the above-mentioned silicon carbide single crystal is re-crystallized and grown on the above-mentioned seed crystal, only the above-mentioned silicon carbide single crystal can be re-crystallized and grown on the above-mentioned seed crystal, and a silicon carbide polycrystal is not allowed to grow or can be deposited selectively on the above-mentioned plate member in the form of ring. In this case, the diameter of the resulting silicon carbide single crystal is constrained corresponding to the size of the above-mentioned plate member in the form of ring.

In the present invention, it is preferable, for the purpose of effecting efficient growth of the above-mentioned silicon carbide single crystal, to use an interference preventing means for preventing interference between the above-mentioned first heating means and the above-mentioned second heating means.

The above-mentioned interference preventing means is not particularly restricted and can be appropriately selected depending on the kind of the above-mentioned first heating means and the above-mentioned second heating means, and the like, and for example, interference preventing coils, interference preventing plates and the like are listed, and when the above-mentioned first heating means and the above-mentioned second heating means are the above-mentioned induction-heatable coil, interference preventing coils and the like are suitably listed.

The above-mentioned interference preventing coil (simply called as "coil" in some cases) is preferably a coil through which induction current flows and having a function of preventing interference between the above-mentioned first heating means and the above-mentioned second heating means by flowing induction current.

The above-mentioned interference preventing coil is preferably placed between the above-mentioned first heating means and the above-mentioned second heating means. This case is preferable in that, when induction heating is conducted by the above-mentioned first heating means and the above-mentioned second heating means simultaneously, induction current flow through the interference preventing coil, and the interference preventing coil can minimize and prevent interference between them.

The above-mentioned interference preventing coil is preferably designed so that it is not heated by induction current flowing through itself, a self-coolable coil is more preferable, and a coil through which a cooling medium such as water and the like can flow is particularly preferable. This case is preferable in that, even if induction current in the above-mentioned first heating means and the above-mentioned second heating means flows through the interference preventing coil, the interference preventing coil is not heated, therefore, the above-mentioned reaction container is also not heated.

The number of winding of the above-mentioned wound interference preventing coil is not particularly restricted and differs depending on the kind of the above-mentioned first heating means and the above-mentioned second heating means and the amount of current flowing through them, and the like and can not be limited to a constant range, namely, even a single coil is sufficient.

As described above, according to the method of producing a silicon carbide single crystal of the present invention, the silicon carbide single crystal of the present invention having high quality can be easily produced efficiently and in condition showing no breakages such as cracking and the like.

(Silicon Carbide Single Crystal)

The silicon carbide single crystal of the present invention is produced by the method of producing a silicon carbide single crystal of the present invention described above.

In the silicon carbide single crystal of the present invention, the crystal defects (pipe defect) of which image is optically detected non-destructively is preferably 100/cm$^2$ or less, more preferably 50/cm$^2$ or less, particularly preferably 10/cm$^2$ or less.

The above-mentioned crystal defect can be detected, for example, by the following manner. Namely, illumination prepared by adding suitable amount of transmission illumination to reflection illumination is allowed to irradiate the silicon carbide single crystal, and the focus of a microscope is adjusted to an opening of crystal defect (pipe defect) on the surface of the silicon carbide single crystal, then, portions continuing to the inside of the pipe defect can be observed as shadow weaker than an image of the opening, connected to the opening. Under such conditions, the whole surface of the silicon carbide single crystal is scanned to obtain a microscope image, then, this microscope image is image-treated, and only forms characteristic to the pipe defect are extracted and the number of them are counted. Thus, the pipe defect can be detected.

According to the above-mentioned detection, only the above-mentioned pipe defect can be correctly detected, from a mixture of defects other than the above-mentioned pipe defect, such as extraneous substances adhered to the surface of the above-mentioned silicon carbide single crystal, polishing flaw, void defect and the like, further, even fine pipe defects of about 0.35 μm can be detected correctly. On the other hand, there is conventionally conducted a method in which the above-mentioned pipe defect parts are selectively etched, and detected in magnification, however, this method has a problem that, adjacent pipe defects described above join mutually, and resultantly, smaller number of defects than the real number of the pipe defects is detected.

The total content of the above-mentioned impurity elements in the above-mentioned silicon carbide single crystal is preferably 10 ppm or less.

(Applications)

The silicon carbide single crystal of the present invention contains no crystal defects such as contamination of polycrystals and polymorphs and micropipes and the like and has extremely high quality, therefore, it is excellent in dielectric breakdown property, heat resistance, radiation resistance and the like and particularly suitable for electronic devices such as semiconductor wafers and the like and optical devices such as light emitting diodes and the like.

As described above, according to the silicon carbide single crystal production apparatus for the present invention, the silicon carbide single crystal of the present invention having high quality can be produced efficiently and easily without breakages such as cracking and the like.

EXAMPLES

The following examples will describe the present invention, but do not limit the scope of the invention at all.

Example 1

Using a silicon carbide single crystal production apparatus 1 shown in FIG. 1, a silicon carbide single crystal was produced. Use of the silicon carbide single crystal production apparatus 1 leads to execution of the silicon carbide single crystal production method of the present invention.

The silicon carbide single crystal production apparatus 1 has a graphite crucible 10 having a container body 12 capable of accommodating a sublimation raw material 40 and a cover body 11 which can be attached to and detached from the container body 12 by spiral fitting, and in which, when installed on the container body 12, a seed crystal 50 of a silicon carbide single crystal can be placed approximately at the center of a surface facing the sublimation raw material 40 accommodated in the container body 12; a supporting rod 31 fixing the graphite crucible 10 to inside of a quartz tube 30; a first induction heating coil 21 placed at a part which is on the outer periphery of the quartz tube and in which the sublimation raw material 40 is accommodated, in the graphite crucible 10; and a second induction heating coil 20 placed at a part which is on the outer periphery of the quartz tube 30 and on which the cover body 11 is situated, in the graphite crucible 10. The graphite crucible 10 is covered with an insulation material (not shown).

The cap 90 as the sealing portion comprises a bottom portion 90a to substantially face the sublimation law material 40 for allowing the installation of the seed crystal 50 at the time of being provided on the reaction container main body 12, and a wall portion 90b provided upright from the rim portion circumference of the bottom portion so as to form the hollow portion together with the bottom portion 90a. The cap 90 is for covering the single crystal growth possible region of the circumferential side portion of the reaction container main body 12 at the time it is mounted on the reaction container main body 12 while being held by a hinge portion 18 provided on the inner wall inner circumference of the reaction container main body 12. The longitudinal direction distance from the lower end to the upper end of the wall portion 90b shown by H in FIG. 1, that is, the cap height was 50 mm. Moreover, the thermal expansion coefficient of the cap 90 at 0 to 100° C. was 3.2×10$^{-6}$ (/K), and the bulk density thereof was 1.82 g/cm$^3$.

The sublimation law material was carbonized silicon powders (6H (partly including 3C), average particle size was 200 μm) obtained by heating a mixture obtained by evenly mixing the high purity tetraethoxy silane polymer as the silicon source and a resol type phenol resin as the carbon source, heating and baking the same under an argon atmosphere.

The seed crystal 50 of a silicon carbide single crystal was a 6H atisine crystal, and the seed crystal thickness was 0.9 mm, and the diameter was 20 mm.

According to the silicon carbide single crystal production apparatus 1, the electric current was supplied to the first induction heating coil 21 for heating the same so that the sublimation law material 40 was heated by the heat. At the time, after heating the bottom portion of the reaction container 12 to 2,540° C., the pressure was maintained at 50 Torr (6,645 Pa) by the argon gas atmosphere. The sublimation law material 40 was heated to the predetermined temperature (2,540° C.) so as to be sublimated.

On the other hand, the lid portion 11 side was heated by the second induction heating coil 20. The set temperature of the lid portion 11 by the second induction heating coil was 2,540° C.

Figure 2:
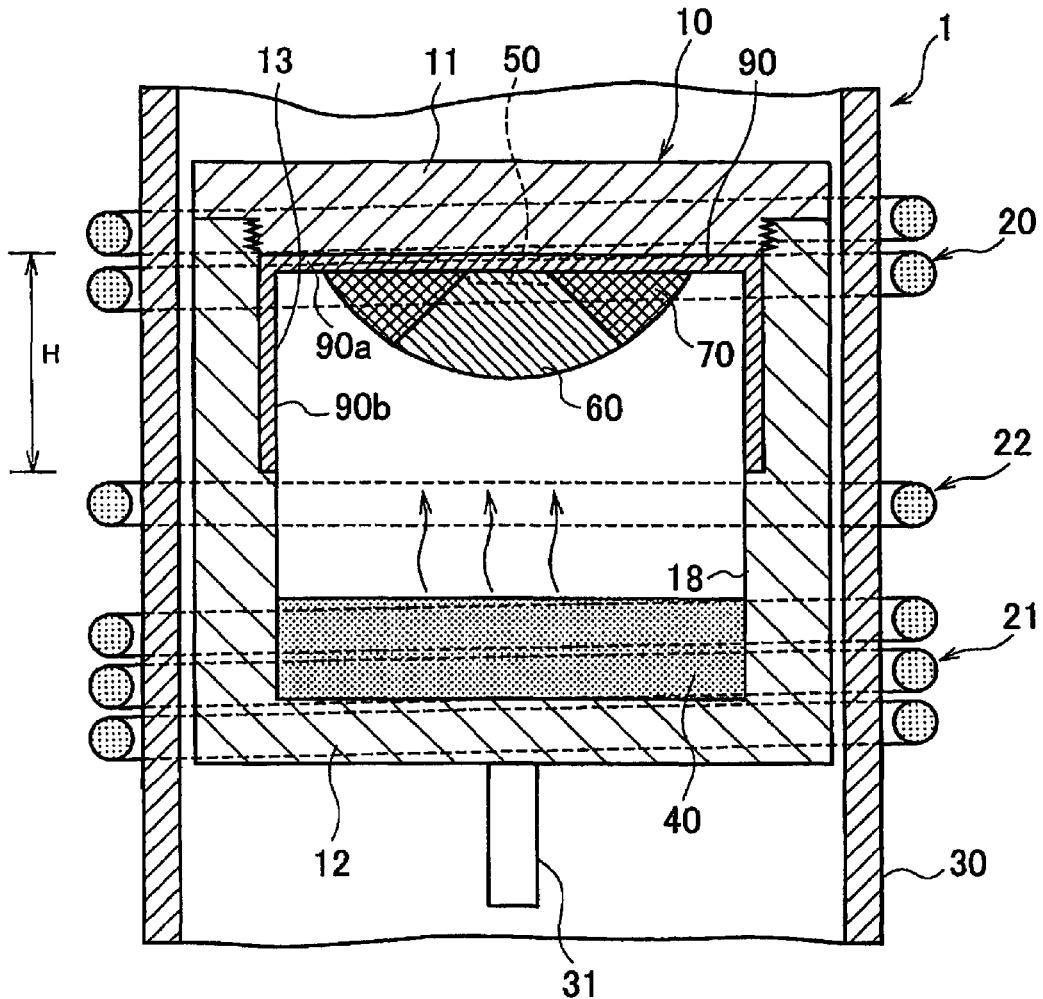
FIG. 2 is a schematic view for illustrating a condition in which a silicon carbide single crystal is being produced by the method of producing a silicon carbide single crystal of the embodiment of the present invention.

Here, a silicon carbide single crystal 60 re-crystallizes and grows on the seed crystal 50 of a silicon carbide single crystal, and a silicon carbide polycrystal 70 re-crystallizes and grows on the outer periphery on the seed crystal 50 of a silicon carbide single crystal, as shown in FIG. 2. In growth of the silicon carbide single crystal 60, a convex form was maintained toward the sublimation raw material 40 side in the all growth processes, and a concave portion sunk toward the cover body 11 side was no shaped in the form of ring, and the silicon carbide single crystal 70 did not grow contacting the peripheral surface part 13 in the container body 12.

Figure 3:
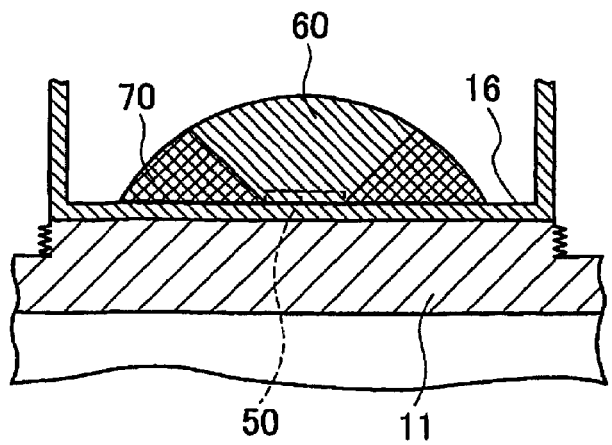
FIG. 3 is a schematic view of the silicon carbide single crystal of the present invention produced by the method of producing a silicon carbide single crystal of the embodiment of the present invention.

As a result, when the silicon carbide single crystal 60 grown was cooled to room temperature, stress based on a difference in thermal expansion was no applied in concentration from the silicon carbide polycrystal 70 side to the silicon carbide single crystal 60 side, and breakages such as cracking and the like did not occur on the resulted silicon carbide single crystal 60, as shown in FIG. 3.

When the resulted silicon carbide single crystal 60 was evaluated, contamination of polycrystals and polymorphs crystals was not found, and crystal defect of micropipes was as scarce as 4/cm$^2$, meaning extremely high quality.

The above-mentioned crystal defect of micropipes was detected as described below, after cutting the resulted silicon carbide single crystal 60 into a thickness of 0.4 mm, mirror polishing to give a wafer having a surface roughness of 0.4 nm, and removing extraneous substances on the surface as much as possible by alkali washing. Namely, illumination prepared by adding suitable amount of transmission illumination to reflection illumination was allowed to irradiate the above-mentioned wafer after alkali washing, the focus of a microscope was adjusted to an opening of micropipes on the wafer surface, then, portions continuing to the inside of the micropipe could be observed as shadow weaker than an image of the opening, connected to the opening. Under such conditions, the whole surface of the above-mentioned wafer was scanned to obtain a microscope image, then, this microscope image was image-treated, and only forms characteristic to the micropipe are extracted and the number of them were counted. Thus, the micropipes were detected. In this detection, even fine micropipes of about 0.35 μm were detected correctly without breakage.

The experiment conditions, the growth diameter and the growth height of the obtained single crystals are shown in the table 1.

results as in the example 1 were obtained. The obtained results are shown in the table 1.

Example 4

An experiment was carried out in the same manner as in the example 1 except that the seed crystal diameter was changed from 20 mm to 50 mm.

As a result, a crystal with the entire surface as the single crystal was obtained without generation of a polycrystalline portion. Moreover, as to the crystal defects, the same results as in the example 1 were obtained.

Example 5

An experiment was carried out in the same manner as in the example 4 except that the growth time was changed from 20 hours to 40 hours.

Figure 9:
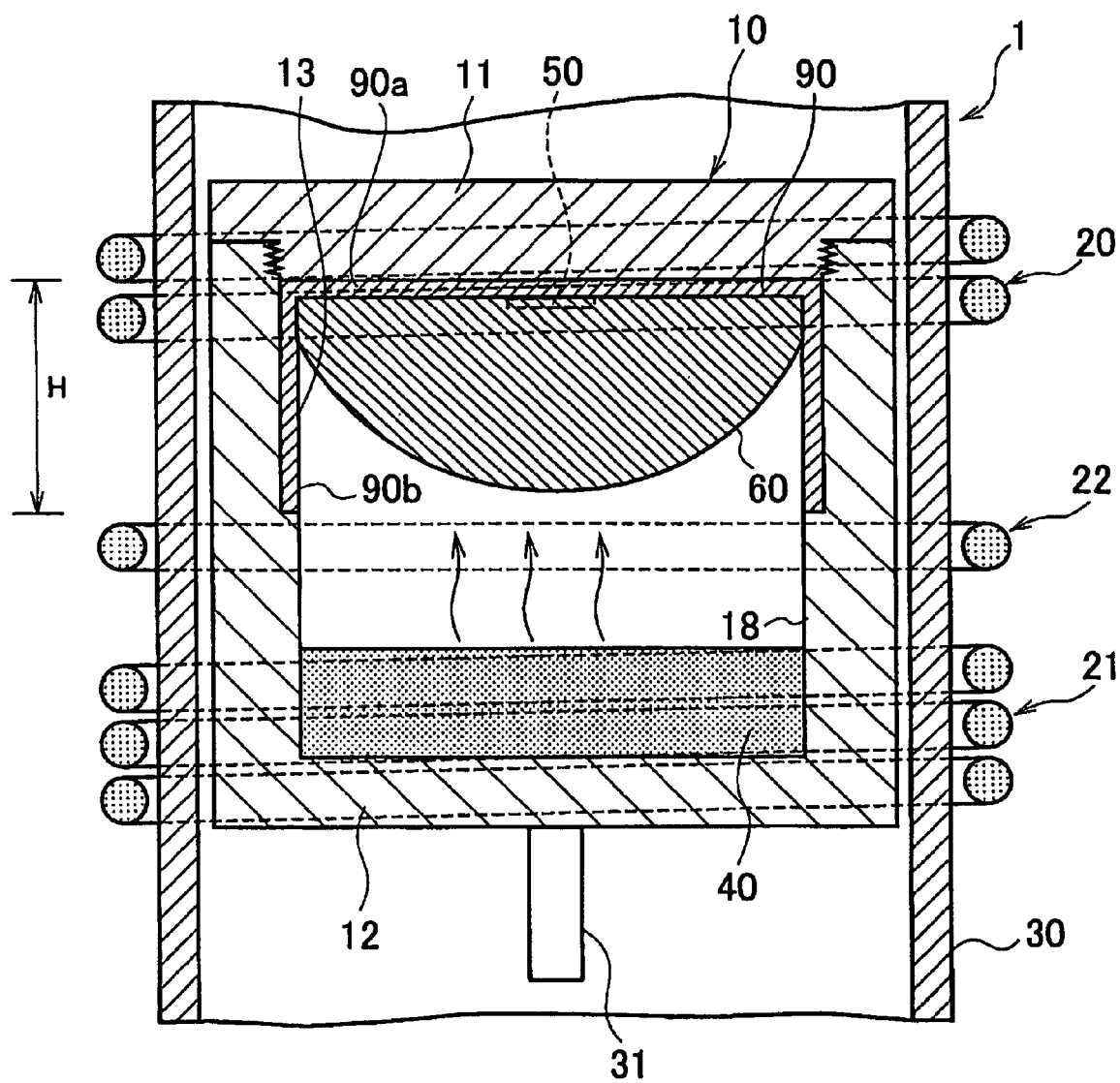
FIG. 9 is a schematic view for illustrating a condition in which a silicon carbide single crystal is being produced by an earlier method of producing a silicon carbide single crystal.

As a result, as shown in FIG. 9, the silicon carbide single crystal 60 was grown with its upper end reaching to the vicinity of the lower end portion on the sublimation law material 40 side of the cap height H and a part of the silicon carbide single crystal 60 reaching to the wall portion 90b of the cap 90 in the reaction container 10. Finally, a crystal with the entire surface as the single crystal having a 31 mm growth height and about a 100 mm growth diameter was obtained. As to the crystal defects, even thought the central portion diameter of about 80 mm was substantially the same as the example 1, the micro pipe generation was found slightly more in the portion of about 10 mm in contact with the circumferential side portion.

Comparative Example 1

Figure 10:
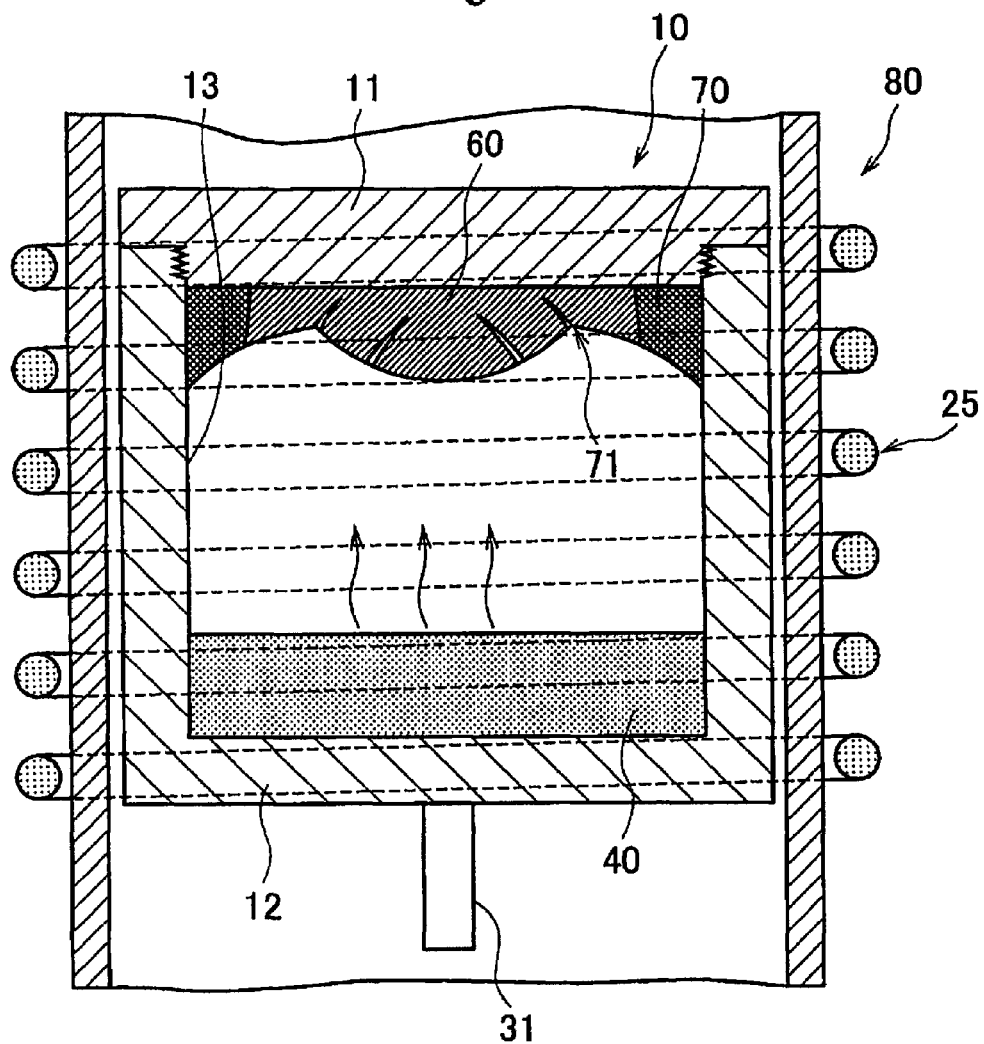
FIG. 10 is a schematic view for illustrating a final condition in which a silicon carbide single crystal is being produced by an earlier method of producing a silicon carbide single crystal.

A silicon carbide single crystal was produced in the same manner as in the example 1 except that a silicon carbide single crystal production apparatus 80 shown in FIG. 10 was used.

Specifically, the cap 90 as the sealing portion was not used. Moreover, the first induction heating coil 21 and the second induction heating coil 20 disposed at a portion on the outer circumference of the quartz pipe 30 for placing the lid portion 11 in the graphite crucible 10 were substituted by an induction heating coil 25 disposed in a spirally wound state on the outer circumference of the quartz pipe 30 for placing

TABLE 1

|  | Seed crystal thickness (mm) | Seed crystal diameter (mm) | Cap height (mm) | First induction heating coil set temperature (° C.) | Second induction heating coil set temperature (° C.) | Growth height (mm) | Growth diameter (mm) | Growth result |
|---|---|---|---|---|---|---|---|---|
| Example 1 | 0.9 | 20 | 50 | 2540 | 2540 | 16 | 80 | Central portion single |
| Example 2 | 0.8 | 20 | 50 | 2527 | 2501 | 11.4 | 66 | crystal (peripheral |
| Example 3 | 3.6 | 20 | 50 | 2540 | 2480 | 10.6 | 54.1 | portion polycrystalline) |
| Example 4 | 0.9 | 50 | 50 | 2540 | 2540 | 16.4 | 84 | Entire surface single |
| Example 5 | 0.9 | 50 | 50 | 2540 | 2540 | 31 | 100 | crystal (without polycrystals) |

Example 2 and Example 3

An experiment was carried out in the same manner as in the example 1 except that the experiment conditions shown in the table 1 (the seed crystal thickness, the cap height, the set temperatures of the first induction heating coil and the second induction heating coil) were changed. The same the graphite crucible 10 substantially by an equal interval without using the interference preventing coil 22.

Figure 11:
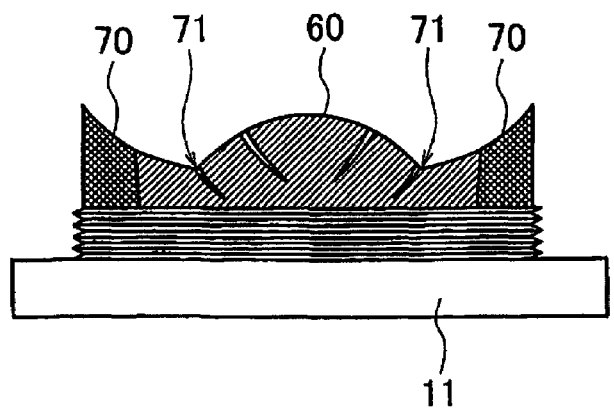
FIG. 11 is a schematic view for illustrating a condition in which a silicon carbide single crystal is being produced by an earlier method of producing a silicon carbide single crystal.

In the comparative example 1, as shown in FIG. 10, the entire surface on the side facing the inside of the reaction container main body 12 of the lid portion 11 was covered with a silicon carbide crystal and the silicon carbide polycrystals 70 of the outer circumferential rim portion of the lid portion 11 were grown in a state in contact with the inner portion circumferential side surface of the reaction container main body 12. In this state, by cooling down to the room temperature, the stress based on the thermal expansion difference was concentrated and applied from the silicon carbide polycrystal 70 side to the silicon carbide single crystal 60 side so as to generate the defects such as cracking were generated in the silicon carbide single crystal 60 as shown in FIG. 11.

Reference Example

The present invention has been explained heretofore with reference to the examples and the comparative example, however, the shape of the sealing portion in the silicon carbide single crystal production apparatus is not particularly limited as long as it has the functions. Therefore, the production apparatus shown in FIGS. 4 to 6, which are same as the production apparatus shown in FIG. 1 except that the sealing portion is substituted can also be used.

Figure 4:
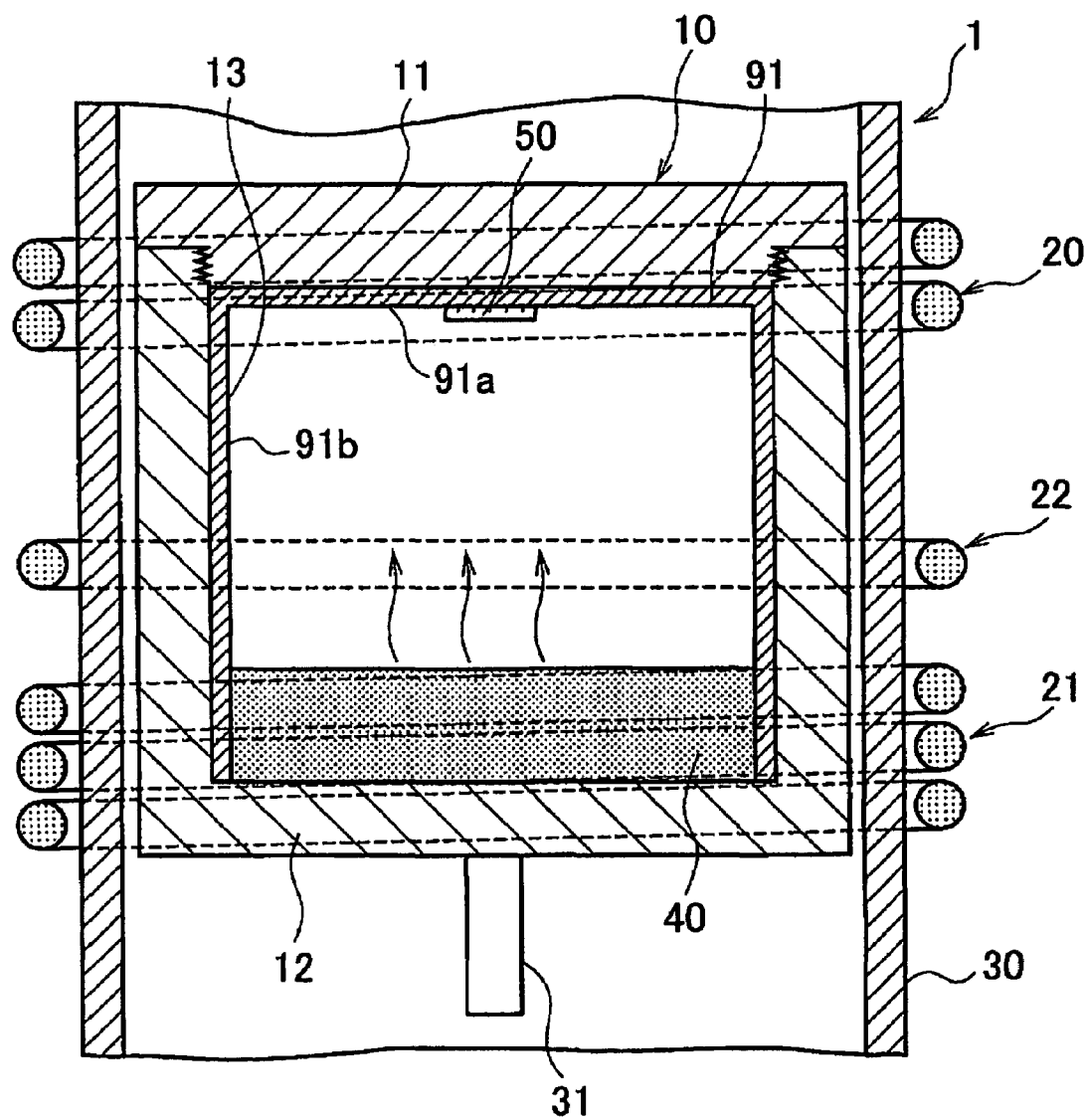
FIG. 4 is a schematic illustration view showing another example of the crucible used in the method of producing a silicon carbide single crystal of the embodiment of the present invention.
Figure 5:
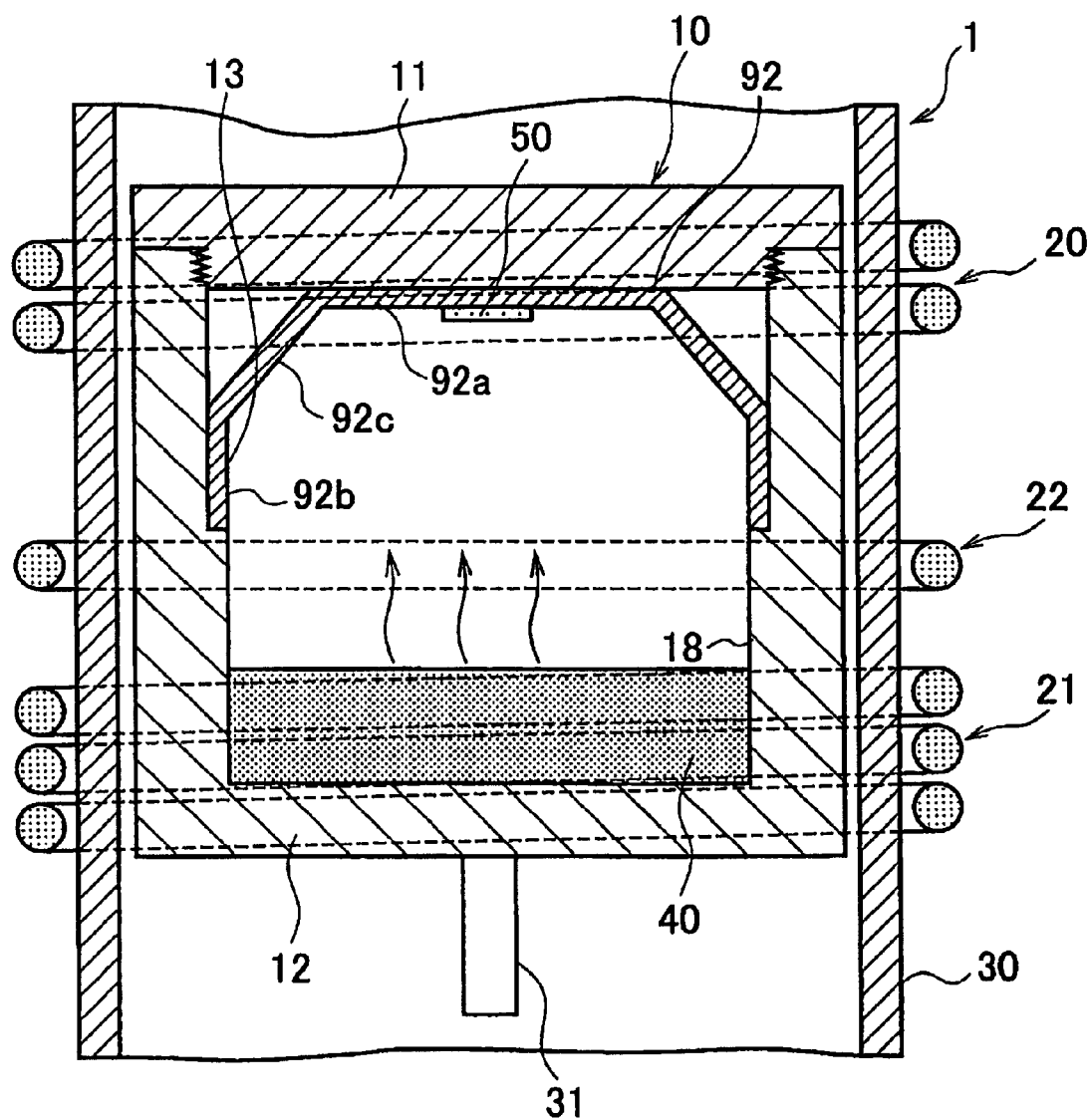
FIG. 5 is a schematic illustration view showing another example of the crucible used in the method of producing a silicon carbide single crystal of the embodiment of the present invention.
Figure 6:
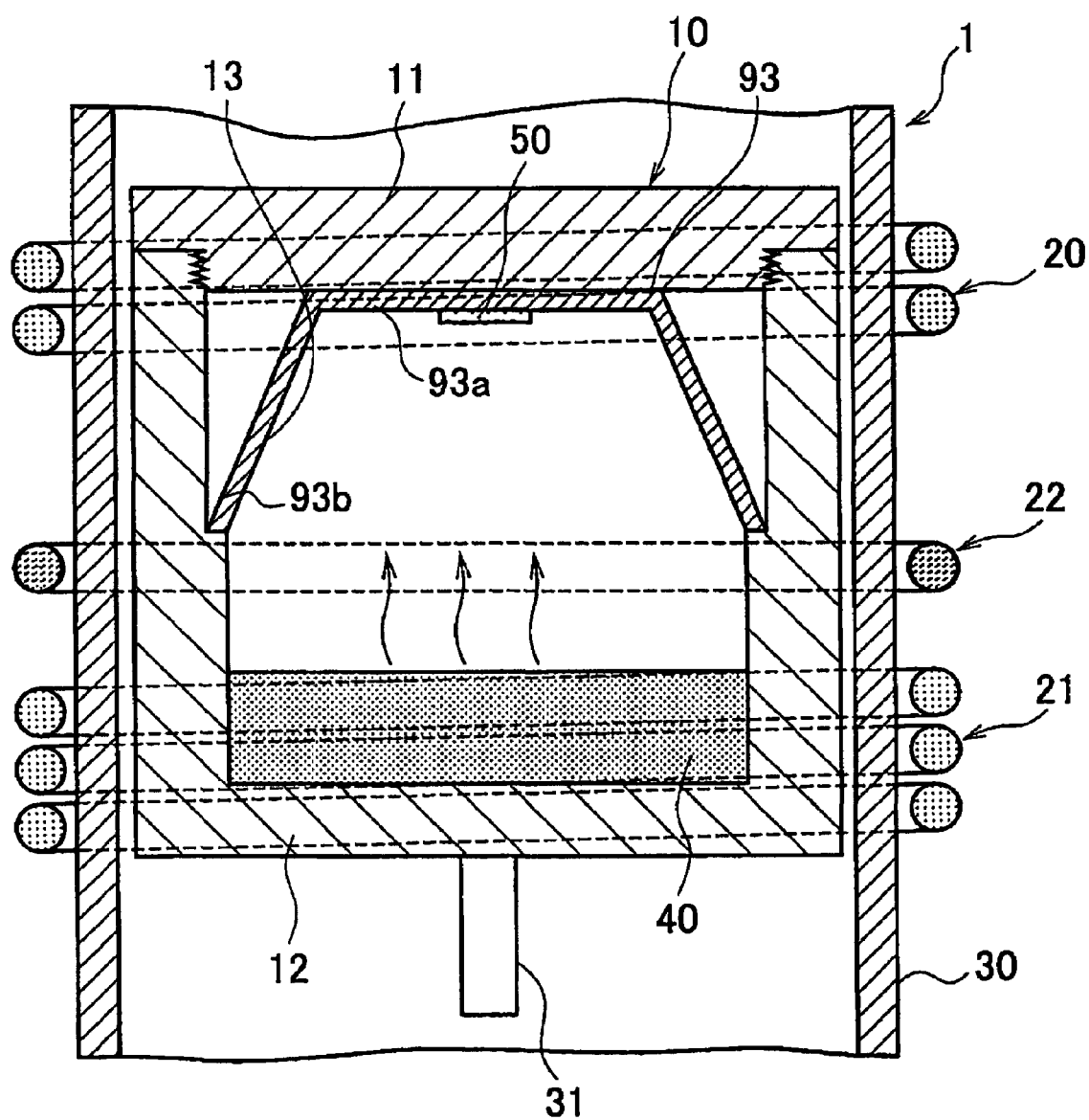
FIG. 6 is a schematic illustration view showing another example of the crucible used in the method of producing a silicon carbide single crystal of the embodiment of the present invention.

That is, as shown in FIG. 4, the sealing portion may have the configuration with the end of the wall portion 91b reaching to the bottom portion of the reaction container main body for supporting the sealing portion at the time of mounting the first surface of the bottom portion of the sealing portion in the reaction container inside so as to substantially face the sublimation law material instead of supporting the sealing portion by the hinge portion provided on the reaction container innerwall. Moreover, as shown in FIG. 5 or FIG. 6, the sealing portion may have a substantially C shaped cross-section so as to be supported by the hinge portion 18 provided on the reaction container inner wall.

Figure 7:
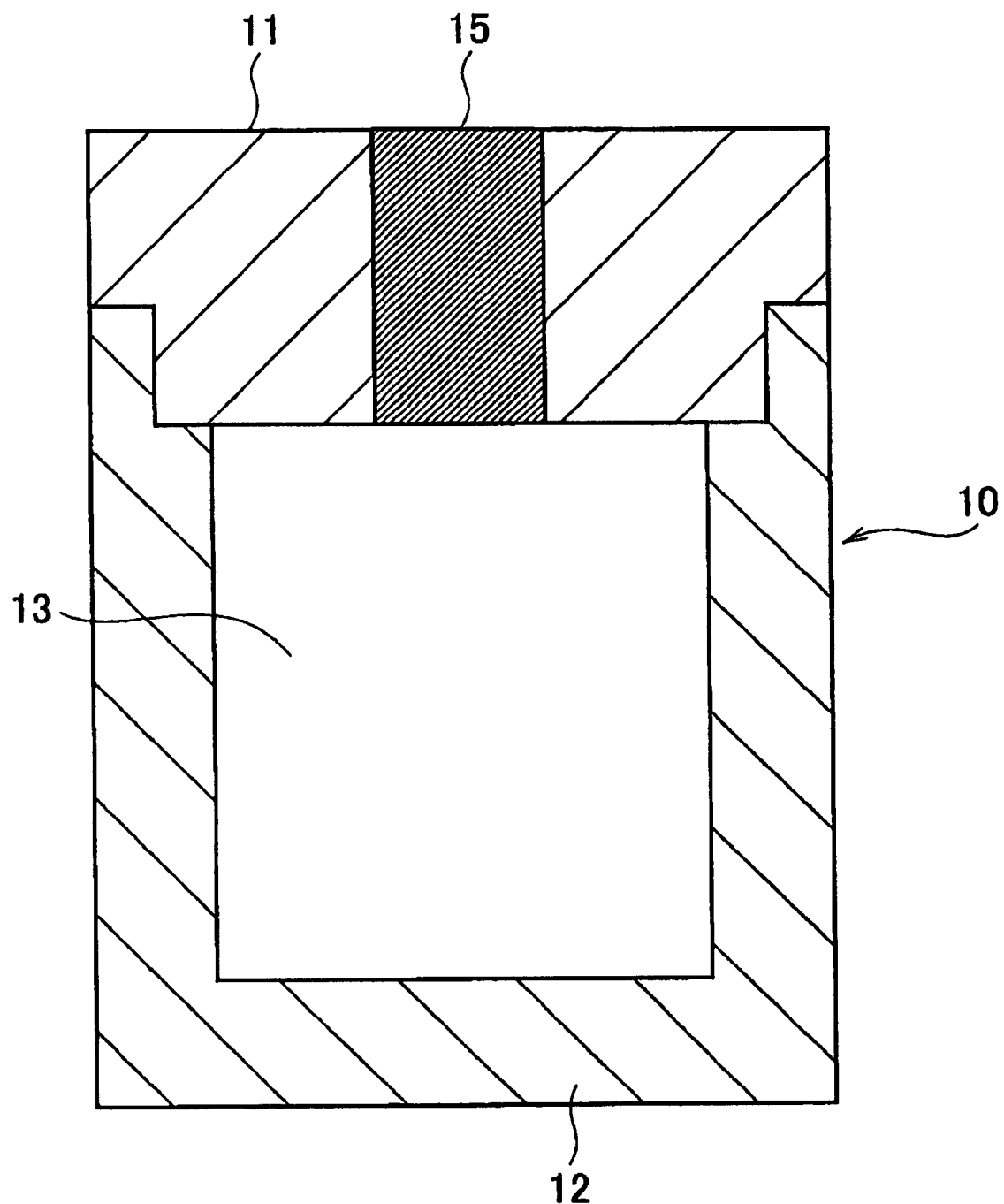
FIG. 7 is a schematic illustration view showing another example of the crucible used in the method of producing a silicon carbide single crystal of the embodiment of the present invention.
Figure 8:
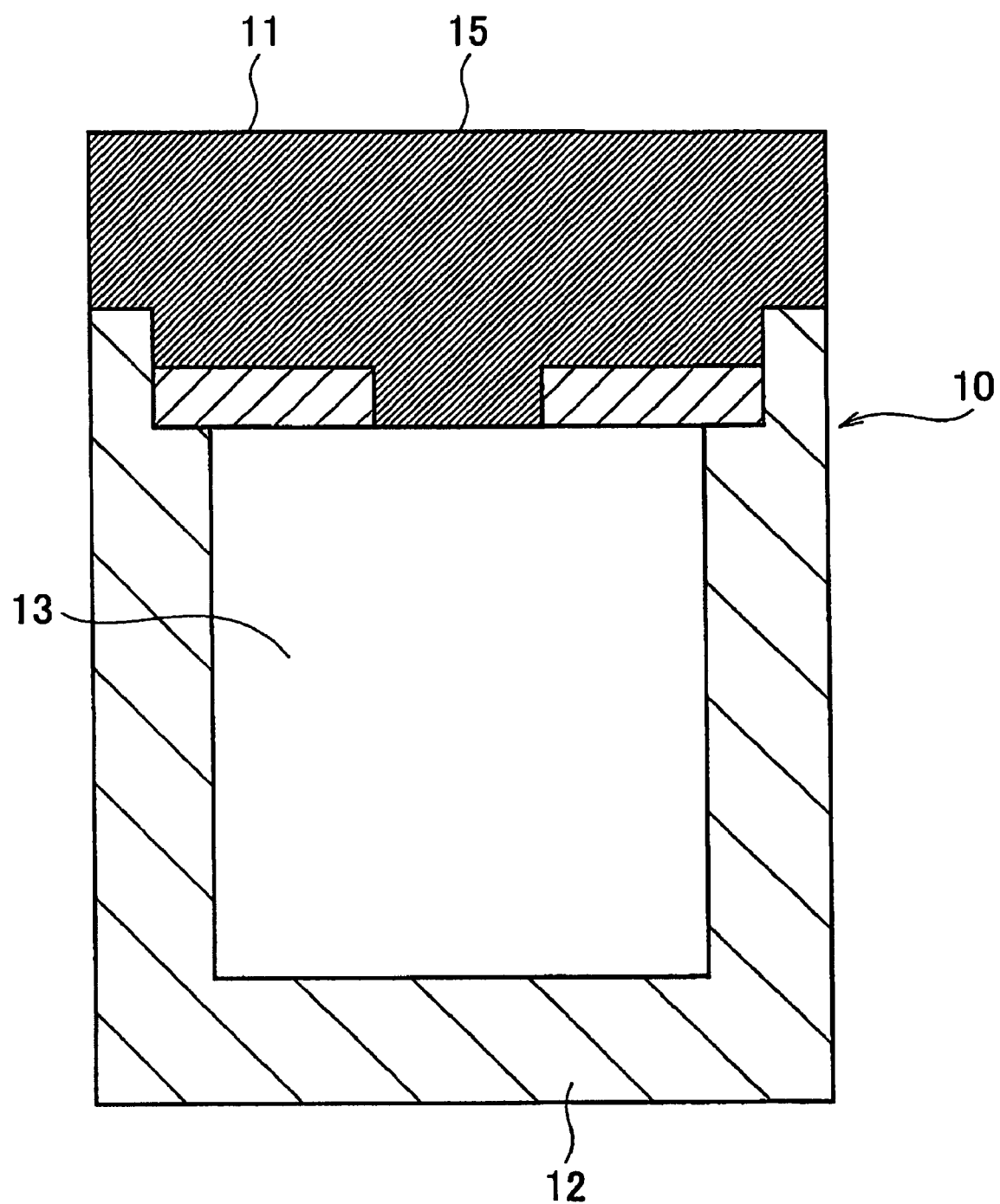
FIG. 8 is a schematic illustration view showing another example of the crucible used in the method of producing a silicon carbide single crystal of the embodiment of the present invention.

Furthermore, the production apparatus, which are same as the production apparatus shown in FIG. 1, FIGS. 4 to 6, except that it is substituted by a lid portion 11 having a member 15 can also be used. Specifically, as shown in FIGS. 7 and 8, the production apparatus comprising another member as the central portion of the lid portion and the outer circumferential portion thereof can also be used.

It will be understood by those skilled in the art that the examples described above are preferable embodiments of the present invention, and a lot of variations and modifications can be carried out without violating the spirit and range of this invention.

According to the present invention, a high quality silicon carbide single crystal excellent in dielectric breakdown property, heat resistance, radiation resistance and the like, particularly suitably for electronic devices such as semiconductor wafers and the like and optical devices such as light emitting diodes and the like, and showing no defects such as contamination of polycrystals and polymorphs and micropipes and the like, and a method and an apparatus capable of generating the above-mentioned high quality silicon carbide single crystal with large diameter efficiently and easily without breakages such as cracking and the like, can be provided.

What is claimed is:

1. A method of producing a silicon carbide single crystal comprising:
   storing a sublimation raw material on a first end portion in a reaction container;
   disposing a seed crystal of a silicon carbide single crystal on a second end portion substantially facing the sublimation raw material in the reaction container; and
   re-crystallizing the sublimated sublimation raw material on the seed crystal to grow a silicon carbide single crystal,
   wherein a sealing portion is provided for covering the single crystal growth possible region in the reaction container to grow a silicon carbide single crystal on the seed crystal provided in the sealing portion while preventing the leak of the sublimated sublimation raw material from the atmosphere for sublimation.

2. The method of producing a silicon carbide single crystal according to claim 1, wherein the thermal expansion coefficient of the sealing portion is substantially the same as that of the seed crystal.

3. The method of producing a silicon carbide single crystal according to claim 2, wherein the material of the sealing portion is a graphite.

4. The method of producing a silicon carbide single crystal according to claim 1, comprising
   growing the silicon carbide single crystal while maintaining the whole growing surface in a convex shape throughout all growth processes.

5. The method of producing a silicon carbide single crystal according to claim 4,
   wherein a crystal of silicon carbide containing a silicon carbide single crystal is grown approximately in a protruded shape.

6. The method of producing a silicon carbide single crystal according to claim 4, comprising
   growing the crystal of silicon carbide containing a silicon carbide single crystal while maintaining the approximate protruded shape and,
   wherein the diameter of the crystal of silicon carbide decreases gradually toward the sublimation raw material throughout all the growth processes.

7. The method of producing a silicon carbide single crystal according to claim 4, comprising:
   storing a sublimation raw material on the first end portion side in the reaction container;
   disposing a seed crystal for a silicon carbide single crystal on the second end portion side in the reaction container;
   forming the sublimation atmosphere so as to enable sublimation of the sublimation raw material by a first heating means disposed on the first end portion side; and
   forming the re-crystallization atmosphere such that the sublimation raw material sublimated by the first heating means is re-crystallized only in the vicinity of the seed crystal of the silicon carbide single crystal by a second heating means disposed on the second end portion side so as to re-crystallize the sublimation raw material on the seed crystal of the silicon carbide single crystal.

8. The method of producing a silicon carbide single crystal according to claim 7,
   wherein the temperature of the re-crystallization atmosphere is lower than the temperature of the sublimation atmosphere by 30 to 300° C., in the reaction container.

9. The method of producing a silicon carbide single crystal according to claim 7,
   wherein the first heating means and the second heating means are an induction-heatable coil.

10. The method of producing a silicon carbide single crystal according to claim 9,
    wherein the current value of the induction heating current in the first heating means is larger than the current value of the induction heating current in the second heating means.

11. The method of producing a silicon carbide single crystal according to claim 9,
wherein the current value of the induction heating current in the second heating means is decreased continuously or gradually with the increase of the diameter of a growing silicon carbide single crystal.

12. The method of producing a silicon carbide single crystal according to claim 9,
wherein an interference preventing means capable of flowing the induction current and preventing interference between the first heating means and the second heating means by flowing the induction current is placed between the first heating means and the second heating means.

13. The method of producing a silicon carbide single crystal according to claim 12, wherein the interference preventing means is a coil through which cooling water can flow.

14. The method of producing a silicon carbide single crystal according to claim 7,
wherein if the temperature at one end side accommodating a sublimation raw material is represented by $T_1$ and the temperature at another end side at which a seed crystal of a silicon carbide single crystal is placed is represented by $T_2$, in the reaction container, and the temperature of the part adjacent to the inner peripheral side surface part of the reaction container at said another end side is represented by $T_3$, then, $T_3T_2$ and $T_1T_2$ increase continuously or gradually.

15. The method of producing a silicon carbide single crystal according to claim 7, wherein the one end is a lower end and another end is an upper end.

16. The method of producing a silicon carbide single crystal according to claim 7, wherein the reaction container is a crucible placed in a quartz tube.

17. The method of producing a silicon carbide single crystal according to claim 7, wherein an inner side region adjacent to the region for carrying out the silicon carbide single crystal growth in the second end portion and an outer side region on the outer circumference of the inner side region are provided as independent members such that one end of the member forming the inner side region is contacted with a sealing portion provided in the reaction container and the other end is exposed to the outside of the reaction container.

18. The method of producing a silicon carbide single crystal according to claim 4, wherein the sublimation raw material is a silicon carbide powder obtained by
using as a silicon source at least one compound selected from high purity alkoxysilanes and alkoxysilane polymers, as a carbon source a high purity organic compound generating carbon by heating;
uniformly mixing the silicon source and the carbon source to obtain a mixture; and
calcinating the resulted mixture by heating under a non-oxidizing atmosphere.

19. The method of producing a silicon carbide single crystal according to claim 18, wherein the silicon source is a tetraalkoxysilane polymer and the carbon source is a phenol resin.

20. The method of producing a silicon carbide single crystal according to claim 18, wherein each content of impurity elements in the silicon carbide powder is 0.5 ppm or less.

21. The method of producing a silicon carbide single crystal according to claim 4, wherein the sublimation raw material is a silicon carbide powder obtained by
using as a silicon source a high purity alkoxysilane, as a carbon source a high purity organic compound generating carbon by heating;
uniformly mixing the silicon source and the carbon source to obtain a mixture; and
calcinating the resulted mixture by heating under a non-oxidizing atmosphere.

22. The method of producing a silicon carbide single crystal according to claim 4, wherein the sublimation raw material is a silicon carbide powder obtained by
using as a silicon source at least one of a high purity alkoxysilane and a polymer of a high purity alkoxysilane, as a carbon source a high purity organic compound generating carbon by heating;
uniformly mixing the silicon source and the carbon source to obtain a mixture; and
calcinating the resulted mixture by heating under a non-oxidizing atmosphere.

23. The method of producing a silicon carbide single crystal according to claim 4, wherein the sublimation raw material is a silicon carbide powder obtained by
using as a silicon source at least one compound selected from the group consisting of high purity methoxysilane, high purity ethoxysilane, high purity propoxysilane and high purity butoxysilane, as a carbon source a high purity organic compound generating carbon by heating;
uniformly mixing the silicon source and the carbon source to obtain a mixture; and
calcinating the resulted mixture by heating under a non-oxidizing atmosphere.

24. The method of producing a silicon carbide single crystal according to claim 4, wherein the sublimation raw material is a silicon carbide powder obtained by
using as a silicon source at least one compound selected from the group consisting of high purity methoxysilane, high purity ethoxysilane, high purity propoxysilane and high purity butoxysilane, and a polymer of them having a polymerization degree of 2 to 15, as a carbon source a high purity organic compound generating carbon by heating;
uniformly mixing the silicon source and the carbon source to obtain a mixture, and calcinating the resulted mixture by heating under a non-oxidizing atmosphere.

25. The method of producing a silicon carbide single crystal according to claim 4, wherein the sublimation raw material is a silicon carbide powder obtained by
using as a silicon source at least one of compound selected from the group consisting of high purity monoalkoxysilanes, high purity dialkoxysilanes, high purity trialkoxysilanes and high purity tetraalkoxysilanes, and a polymer of them having a polymerization degree of 2 to 15, as a carbon source a high purity organic compound generating carbon by heating;
uniformly mixing the silicon source and the carbon source to obtain a mixture; and
calcinating the resulted mixture by heating under a non-oxidizing atmosphere.

26. The method of producing a silicon carbide single crystal according to claim 1, comprising
growing the silicon carbide single crystal while the entire surface excluding the growth surface contacts the sealing portion throughout all growth processes.

27. The method of producing a silicon carbide single crystal according to claim 26, wherein the crystal of silicon carbide containing a silicon carbide single crystal is composed only of a silicon carbide single crystal.

28. The method of producing a silicon carbide single crystal according to claim 1, comprising
growing the silicon carbide single crystal only in regions of the second end portion excluding parts adjacent to the peripheral wall surface portion of the reaction container.

29. The method of producing a silicon carbide single crystal according to claim 1, wherein the surface of the part adjacent to the peripheral side surface part in the reaction container at another end is made of glassy carbon.

30. A silicon carbide single crystal production apparatus, comprising at least a crucible having a reaction container main body capable of storing a sublimation raw material; a lid portion provided detachably to the reaction container main body; and a sealing portion inside the reaction container having substantially the same thermal expansion coefficient as that of the seed crystal, capable of placing a silicon carbide single crystal, for preventing the leak of the sublimated sublimation raw material.

31. The silicon carbide single crystal production apparatus according to claim 30, wherein the sealing portion comprises a bottom portion having a first surface to substantially face to the sublimation raw material for allowing the installation of the seed crystal at the time of being provided on the reaction container main body and a second surface facing the lid portion, and a wall portion provided upright from the rim portion circumference of the first surface of the bottom portion so as to form the hollow portion together with the first surface of the bottom portion, such that the single crystal growth possible region of the circumferential side portion of the reaction container is covered at the time the first surface of the bottom portion is provided in the reaction container substantially facing the sublimation raw material.

32. The silicon carbide single crystal production apparatus according to claim 31, wherein the material of the sealing portion is a graphite.

33. The silicon carbide single crystal production apparatus according to claim 30, further comprising:
a first induction heating coil disposed in a spirally wound state on the outer circumference of the portion for storing the sublimation raw material in the crucible for forming the atmosphere for sublimation for allowing sublimation of the sublimation raw material; and
a second induction heating coil disposed in a spirally wound state on the outer circumference of the portion for storing the seed crystal in the crucible for forming the re-crystallization atmosphere for re-crystallization for allowing the re-crystallization of the sublimation raw material sublimated by the first induction heating coil only in the vicinity of the seed crystal of the silicon carbide single crystal to re-crystallize the sublimation raw material on the seed crystal of the silicon carbide single crystal.

34. The silicon carbide single crystal production apparatus according to claim 33, wherein an interference preventing means is disposed between the first heating means and the second heating means, capable of supplying an induction electric current and preventing the interference between the first induction heating means and the second induction heating means by supplying the induction electric current.

35. The silicon carbide single crystal production apparatus according to claim 34, wherein the interference preventing coil is a coil allowing passage of the cooling water.

* * * * *